(12) United States Patent
Tobita

(10) Patent No.: US 6,377,499 B1
(45) Date of Patent: Apr. 23, 2002

(54) REFRESH-FREE SEMICONDUCTOR MEMORY DEVICE

(75) Inventor: Youichi Tobita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/797,984

(22) Filed: Mar. 5, 2001

(30) Foreign Application Priority Data

Sep. 18, 2000 (JP) ........................................ 2000-281446

(51) Int. Cl.⁷ ................................................ G11C 7/00
(52) U.S. Cl. ..................................................... 365/222
(58) Field of Search ........................... 365/222, 189.07, 365/189.08, 194, 195, 201, 233.5

(56) References Cited

U.S. PATENT DOCUMENTS 4,203,159 A * 5/1980 Wanlass ...................... 365/222
4,827,453 A * 5/1989 Sawada et al. ............. 365/222
5,724,296 A * 3/1998 Jang ............................ 365/222

FOREIGN PATENT DOCUMENTS

| JP | 55-153194 | 11/1980 |
| JP | 61-11993 | 1/1986 |
| JP | 2-21488 | 1/1990 |

OTHER PUBLICATIONS

K. Nogami, et al., "1–Mbit Virtually Static RAM", IEEE Journal of Solid–State Circuits, vol. SC–21, No. 5, Oct. 1986, pp. 662–667.

* cited by examiner

Primary Examiner—Trong Phan
(74) Attorney, Agent, or Firm—McDermott, Will & Emery

(57) ABSTRACT

In the structure having normal bit lines and refresh bit lines, each memory cell MC is formed into a four-transistor/two-capacitor memory cell, and complementary data is read onto a corresponding bit line pair. Thus, a semiconductor memory device capable of performing a stable data read operation and having an excellent data retention characteristics can be realized.

20 Claims, 25 Drawing Sheets

F I G. 1 1
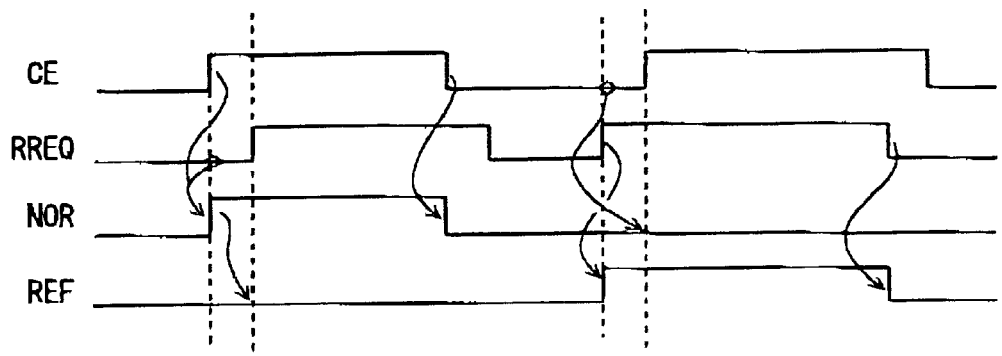
F I G. 1 2
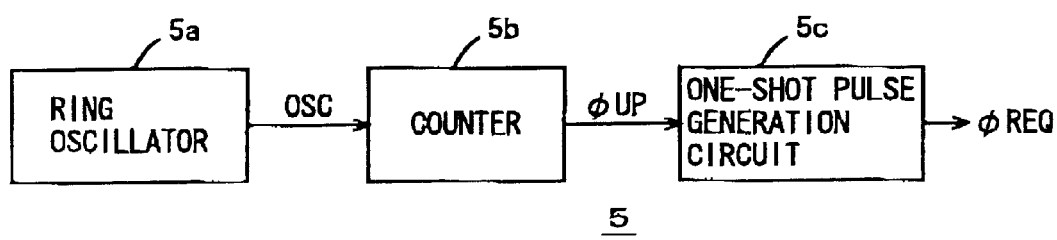
F I G. 1 3
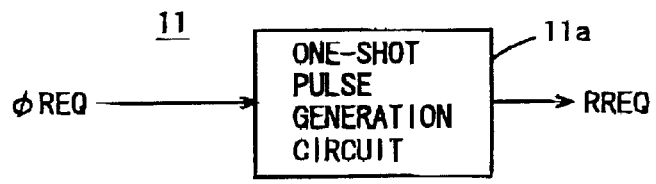
F I G. 1 4
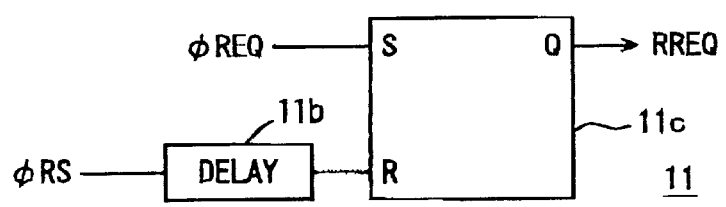

REFRESH-FREE SEMICONDUCTOR MEMORY DEVICE

BACKGROUND OF THE INVENTION

1. Field of the Invention

The present invention relates to a semiconductor memory device, and particularly, relates to a semiconductor memory device capable of being stably accessed at a high speed with low current consumption. More particularly, the present invention relates to a memory cell structure of a semiconductor memory device such as DRAM (Dynamic Random Access Memory) that requires refresh of the data stored therein.

2. Description of the Background Art

FIG. 44 is a diagram schematically showing the structure of an Pay portion of a conventional DRAM (dynamic Random Access Memory). FIG. 44 exemplarily shows 2-bit memory cells MC1 and MC2, In FIG. 44, the memory cell MC1 is located corresponding to the intersection of a word line WL1 and a bit line BL, and the memory cell MC2 is located corresponding to the intersection of a word line WL2 and a bit line /BL. The memory cell MC1 includes a memory cell capacitor CS1 for storing information, and an access transistor MQ1 for connecting the capacitor CS1 to the bit line BL according to a word line selection signal $\phi$WL1 on the word line WL1. The memory cell MC2 includes a capacitor CS2 for storing information, and an access transistor MQ2 for connecting the capacitor CS2 to the bit line /BL according to a word line selection signal $\phi$WL2 on the word line WL2. These access transistors MQ1 and MQ2 are each formed of an N-channel MOS transistor (insulated-gate field effect transistor).

A sense amplifier SA activated in response to activation of a sense amplifier activation signal $\phi$SA for differentially amplifying and latching voltages on the bit lines BL and /BL is provided on the bit lines BL and /BL.

A cell plate voltage at a predetermined voltage level is applied to respective electrode nodes (cell plate nodes) of the capacitors CS1 and CS2. In the memory cells MC1 and MC2, charges corresponding to the stored data are retained at storage nodes SN1 and SN2. Now, the operation of the DRAM shown in FIG. 44 will be described with reference to a signal waveform diagram shown in FIG. 45.

In the standby state, the word line selection signals $\phi$WL1 and $\phi$WL2 are both held at L level, and in the memory cells MC1 and MC2, the access transistors MQ1 and MQ2 are both in the OFF state. The bit lines BL and /BL are precharged and equalized to an intermediate voltage level by a not-shown bit line precharge/equalize circuit.

When an active cycle is started, a row selection operation is performed according to an external address signal, and a word line corresponding to the addressed row is driven to the selected state. It is now assumed that the word line WL1 is selected and the voltage level of the word line selection signal $\phi$WL1 is raised, as shown in FIG. 45. In this case, in the memory cell MC1, the access transistor MQ1 is turned ON, and charges accumulated in the storage node SN1 of the capacitor CS1 are transmitted onto the bit line BL Since there is no memory cell at the intersection of the bit line /BL and word line WL1, the bit line /BL is kept at the precharge voltage level FIG. 45 shows exemplary signal waveforms in the case where the L-level data is read from the memory cell MC1 onto the bit line BL.

When the voltage difference between the bit lines BL and /BL is sufficiently developed, the sense amplifier activation signal $\phi$SA is activated. Accordingly, the sense amplifier SA differentially amplifies the voltages on the bit lines BL and /BL, so that the voltage levels on the bit lines BL and /BL are respectively driven to the ground voltage level and power supply voltage level and latched.

When the active cycle is completed, the word line selection signal $\phi$WL1 is driven to the non-selected state, whereby the access transistor MQ1 is turned OFF Subsequently, the sense amplifier activation signal $\phi$SA is deactivated, whereby the sense amplifier SA is rendered inactive. The bit lines BL and /BL are restored to the precharge voltage level.

As shown in FIG. 44, the memory cells MC1 and MC2 of the DRAM store information in the respective capacitors CS1 and CS2 in the form of charges. The storage node electrodes SN1 and SN2 of these capacitors are respectively connected to the access transistors MQ1 and MQ2, and therefore the charges stored in the capacitors CS1 and CS2 are discharged to the substrate due to a leak current Moreover, in the case where the voltage levels on the bit lines BL and /BL change according to the selected memory cell data, the charges accumulated in the capacitor of the non-selected memory cell leak through the access transistor. Accordingly, in order to compensate for the change in the charge accumulation amount due to leakage of the charges stored in the storage nodes SN1 and SN2, a refresh operation is performed in the DRAM. In the refresh operation of the memory cell MC1, the data in the memory cell MC1 is read onto the bit line BL, and then amplified by the sense amplifier SA and rewritten to the memory cell MC1. Thus, the stored data in the memory cell MC1 is restored. This refresh operation must be performed periodically.

In order to achieve increase in operation speed of the semiconductor memory device, reduction in current consumption and size of a processing system, and the like, the elements of the semiconductor memory device are reduced in dimensions. As a result of such dimensional reduction of the elements, the memory cell capacitors have a reduced area, and thus have a reduced capacitance value. The memory cell capacitor having a reduced capacitance value has a reduced charge storage amount (Q=V·C) even with the data at the same voltage level being written thereto. Therefore, even a slight amount of leak current causes a significant change in the voltage level of the storage data, thereby degrading the data retention characteristics. In order to compensate for such degradation in data retention characteristics, a refresh cycle must be reduced. However, an external processing device cannot access the DRAM during the refresh operation. Therefore, such a reduced refresh cycle results in degradation in performance of the processing system, Moreover, the reduced refresh cycle increases current consumption for the refresh operation. In particular, the condition of low standby current as required in the data retention mode (e.g., sleep mode) of a battery-driven portable equipment or the like cannot be sated. As a result, refreshing with such a reduced refresh cycle cannot be applied to applications such as the battery-driven portable equipment requiring low current consumption.

A pseudo SRAM (PSRAM) for operating the DRAM like an SRAM (Static Random Access Memory) is known as one method to solve the problems regarding the refresh of the DRAM This PSRAM is configured to successively perform, within a single memory access cycle, the two cycles of a normal data write/read cycle and a refresh cycle. Thus, the refresh can be performed in a single access cycle and can be concealed from the external access, thereby enabling the DRAM to be apparently operated as SRAM.

However, the PSRAM is required to perform the operation of two cycles within a single access cycle, and therefore the cycle time cannot be reduced. In particular, it is difficult for the PSRAM to realize the operation cycle of 70 to 80 nanoseconds (ns) required for the SRAM in the current 0.18-micron manufacturing technology.

The structure in which a refresh port and a normal access port are separately provided so as to internally perform the refresh operation of the DRAM independently of the external access by using the refresh port is shown in, e.g., Japanese Patent Laid-Open Applications Nos. 2-21488, 61-11993 and 55-153194.

However, in these conventional examples, in the case where the memory tells are reduced in data retention characteristics due to the dimensional reduction thereof, the internal refresh interval must be reduced Therefore, current consumption in the data retention mode such as sleep mode cannot be reduced.

Moreover, the problems resulting from the dimensional reduction of the elements also cause a degraded sense margin of the sense amplifier. More specifically, if the capacitance value of the memory cell capacitors is reduced, a read voltage read onto the bit line BL or /BL is reduces. This read voltage is normally determined by the ratio of the capacitance value Cs of the memory cell capacitor to the capacitance value Cb of the bit line. Accordingly, such a reduced capacitance value of the memory cell capacitor results in a reduced read voltage. The sense amplifier SA, which amplifies the read voltage, cannot accurately perform the sensing operation if the read voltage is reduced, resulting in a degraded sense margin. Such degradation in sense margin due to the dimensional reduction of the elements is not at all considered in the above-mentioned conventional examples.

Moreover, the bit lines BL and /BL are in an electrically floating state in selection of a word line. In the case where the selected word line is capacitively coupled to the bit line through the gate capacitance of the access transistor, the voltage level on the bit line having the memory cell connected thereto is raised, and the voltage level (read voltage) of the data read from the memory cell is changed. On the other hand, since the other reference bit line does not have any memory cell connected thereto, such capacitive coupling through the access transistor is not caused. With the elements being reduced in dimensions and the read voltage being reduced, even a slight voltage change due to the capacitive coupling through the gate capacitance greatly affects the read voltage, whereby the memory cell data cannot be sensed accurately.

SUMMARY OF THE INVENTION

It is an object of the present invention to provide a semiconductor memory device having an excellent data retention characteristics.

It is another object of the present invention to provide a semiconductor memory device capable of stably reading the memory cell data.

It is still another object of the present invention to provide a semiconductor memory device capable of reducing current consumption in the standby state.

It is yet another object of the present invention to provide a semiconductor memory device capable of implementing a high-speed data processing system.

It is further another object of the present invention to provide a semiconductor memory device suitable for use in applications such as battery-driven portable equipment.

A semiconductor memory device according to the present invention includes: a plurality of memory cells arranged in rows and columns; a plurality of normal bit line pairs provided corresponding to the respective memory cell columns and each having the memory cells of a corresponding column connected thereto; and a plurality of refresh bit line pairs provided corresponding to the respective memory cell columns and each having the memory cells of a corresponding column connected thereto. Each normal bit line pair has first and second normal bit lines, and each refresh bit line pair has first and second refresh bit lines.

Each memory cell includes a first transistor provided between the first normal bit line of a corresponding column and a first storage node, a first capacitance provided between the first storage node and a constant voltage source, a second transistor provided between the first refresh bit line of the corresponding column and the first storage node, a third transistor provided between the second normal bit line of the corresponding column and a second storage node, a second capacitance provided between the second storage node and the constant voltage source, and a fourth transistor provided between the second storage node and the second refresh bit line of the corresponding column.

The semiconductor memory device of the present invention further includes: a plurality of normal word lines provided corresponding to the respective memory cell rows and each having the first and third transistors of the memory cells of a corresponding row connected thereto; and a plurality of refresh word lines provided corresponding to the respective memory cell rows and each having the second and fourth transistors of the memory cells of a corresponding row connected thereto.

When a memory cell is selected, the memory cell capacitances are connected to the respective bit lines of a corresponding bit line pair Thus, complementary data is read onto the bit line pair, whereby the read voltage can be effectively increased Accordingly, even if the elements have been dimensionally reduced, a sufficiently large read voltage can be produced, whereby the sensing operation can be stably performed.

Moreover, the refresh bit lines and normal bit lines are separately provided. Therefore, the refresh operation can be performed independently of an external access As a result, the refresh operation can be effectively concealed from an outside, whereby high-speed external access can be realized.

Moreover, by reading the complementary data onto the bit line pair, the refresh cycle can be increased to such an extent that the voltage difference between the bit lines corresponds to substantially the same bit line read voltage as that of the conventional examples. Accordingly, the refresh interval can be increased, As a result, fast access with a reduced refresh current and a reduced waiting time of a processor can be realized.

Moreover, the read voltage is effectively increased as compared to the conventional examples. Therefore, the sensing operation can be started at a faster timing, whereby high-speed access can be realized.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a signal waveform diagram representing the operation of an arbitration circuit of the semiconductor memory device shown in FIG. 7.

FIG. 12 is a diagram schematically showing the structure of a refresh timer shown in FIG. 7.

FIG. 13 is a diagram schematically showing the structure of a refresh instruction signal generation circuit shown in FIG. 7.

FIG. 14 is a diagram showing a modification of the refresh instruction signal generation circuit shown in FIG. 7.

DESCRIPTION OF THE PREFERRED EMBODIMENTS

Embodiment 1

Figure 1:
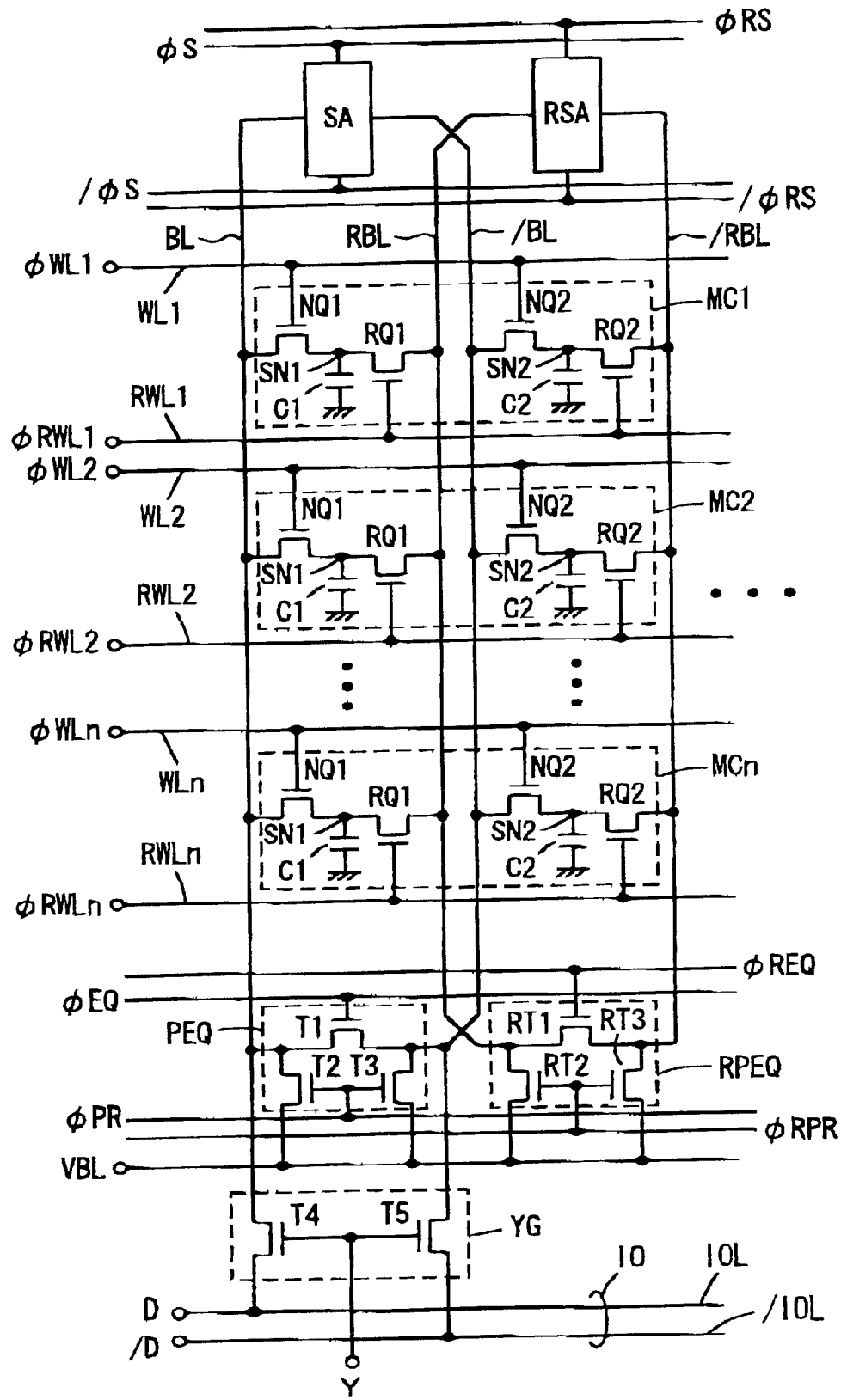
FIG. 1 is a diagram showing the structure of an array portion of a semiconductor memory device according to Embodiment 1 of the present invention.

FIG. 1 is a diagram schematically showing the structure of a main portion of a semiconductor memory device according to Embodiment 1 of the present invention FIG. 1 shows the structure of a portion associated with memory cells MC1 to MCn arranged in a single column. Normal word lines WL1 to WLn to be selected according to an external address, and refresh word lines RWL1 to RWLn to be selected according to a refresh row address are provided. These normal word lines WL1 to WLn and refresh word lines RWL1 to RWLn are arranged corresponding to the respective memory cell rows. Accordingly, a normal word line WLi and a refresh word line RWLi are provided corresponding to a single memory cell row.

Normal bit lines BL and /BL as well as refresh bit lines RBL and /RBL are provided corresponding to the memory cells MC1 to MCn. The data in the memory cell MC (MC1 to MCn) is read onto the normal bit lines BL and /BL in normal data access, whereas the memory cell data is read onto the refresh bit lines RBL and /RBL and rewritten in refresh operation. In other words, a data access bit line pair and a refresh bit line pair are separately provided for each memory cell column Dung the normal access as well, the memory cell data is refreshed using the refresh bit lines.

The memory cells MC1 to MCn have the same structure, and each includes capacitors C1 and C2 for storing information, an access transistor NQ1 responsive to a signal on the normal word line WLi for connecting the capacitor C1 to the bit line BL, a refresh transistor RQ1 responsive to a signal on the refresh word line RWLi for connecting the capacitor C1 to the refresh bit line RBL, an access transistor NQ2 responsive to a signal on the word line WLi for connecting the capacitor C2 to the normal bit line /BL, and a refresh transistor RQ2 responsive to a signal on the refresh word line RWLi for connecting the capacitor C2 to the refresh bit line /RBL, These transistors NQ1, NQ2, RQ1 and RQ2 are each formed of an N-channel MOS transistor.

The normal bit lines BL and /BL are provided with a normal bit line precharge/equalize circuit PEQ responsive to a normal bit line precharge instruction signal φPR and a normal bit line equalize instruction signal φEQ for precharging and equalizing these bit lines BL and /BL to an intermediate voltage VBL, a column selection gate YG responsive to a column selection signal Y for connecting the bit lines BL and /BL to an internal data bus IO, and a sense amplifier SA activated in response to sense amplifier activation signals φS and /φS for differentially amplifying and latching voltages on the bit lines BL and /BL.

The refresh bit lines RBL and /RBL are provided with a refresh bit line precharge/equalize circuit RPEQ responsive to a refresh bit line precharge instruction signal φRPR and a refresh bit line equalize instruction signal φREQ for precharging and equalizing the refresh bit lines RBL and /RBL to the intermediate voltage VBL, and a refresh sense amplifier RSA activated in response to activation of refresh sense amplifier activation signals φRS and /φRS for differentially amplifying and latching voltages on the refresh bit lines RBL and /RBL. The refresh bit lines RBL and /RBL are provided in order to refresh the memory cell data, and need not be subjected to the external data access Therefore, a column selection gate is not provided for the refresh bit lines RBL and /RBL.

The bit line precharge/equalize circuit PEQ includes an N-channel MOS transistor T1 rendered conductive in response to the normal bit line equalize instruction signal φEQ for electrically short-circuiting the bit lines BL and /BL, and N-channel MOS transistors T2 and T3 responsive to the normal bit line precharge instruction signal φPR for transmitting the intermediate voltage VBL to the bit lines BL and /BL.

The refresh bit line precharge/equalize circuit RPEQ includes an N-channel MOS tractor RT1 rendered conductive in response to the refresh bit line equalize instruction signal φRFQ for electrically short-circuiting the refresh bit lines RBL and /RBL, and N-channel MOS transistors RT2 and RT3 rendered conductive in response to the refresh precharge instruction signal φRPR for transmitting the intermediate voltage VBL to the refresh bit lines RBL and /RBL, respectively.

The column selection gate YG includes N-channel MOS transistors T4 and T5 rendered conductive in response to the column selection signal Y for connecting the normal bit lines BL and /BL respectively to internal data line IOL and /IOL. Now, the operation will be described briefly.

In the normal data access, a normal word line is selected according to an external address signal. It is now assumed that the normal word line WL1 is selected. In this case, the word line selection signal φWL1 rises to H level. Thus, in the memory cell MC1, the access transistors NQ1 and NQ2 are turned ON, and the capacitors C1 and C2 are coupled to the normal bit lines BL and /BL, respectively. Charges accumulated in storage nodes SN1 and SN2 are transmitted to the bit lines BL and /BL respectively, whereby the respective voltage levels on the bit lines BL and /BL are both changed.

The sense amplifier SA is activated in response to activation of the sense amplifier activation signals φS and /φS to differentially amplify and latch the voltages appearing on the bit lines BL and /BL. Then, the column selection signal Y is driven to the selected state according to a column address. Accordingly, the column selection gate YG is rendered conductive, and the bit lines BL and /BL are connected to the internal data lines IOL and /IOL respectively, whereby the data write or read operation is performed.

In the refresh operation, a refresh word line is driven to the selected state according to a refresh address signal It is now assumed that the refresh word line RWL1 is selected according to the refresh address, In this case, the refresh word line selection signal φRWL1 rises to H level. Thus, the refresh transistors RQ1 and RQ2 are rendered conductive, and the capacitors C1 and C2 are coupled to the refresh bit lines RBL and /RBL, respectively. Accordingly, in this case, charges accumulated in the storage nodes SN1 and SN2 are transmitted to the refresh bit lines RBL and /RBL respectively, whereby the voltage difference is produced between the refresh bit lines RBL and /RBL. The refresh sense amplifier RSA is activated in response to activation of the refresh sense amplifier activation signals φRS and /φRS to differentially amplify the potential difference between the refresh bit lines RBL and /RBL. The complementary data, which is present on the refresh bit lines RBL and /RBL, is rewritten to the storage nodes SN1 and SN2.

A refresh path and normal access path are separately provided so as to operate independently of each other, Accordingly, for example, even if the refresh word line RWL1 is driven to the selected state while the normal word line WL1 is in the selected state, the data stored in the memory cell MC1 is read onto the refresh bit lines RBL and /RBL provided separately from the normal bit lines BL and /BL, whereby the refresh operation is performed. Therefore, the refresh operation can be performed, in parallel with the normal access operation, according to a refresh request signal internally generated at a predetermined cycle.

In other words, the external access can be made without consideration of the refresh operation, and the refresh operation does not adversely affect the normal access operation, thereby realizing high-speed access, Moreover, since an external processing device need not interrupt the access for the refresh operation, the waiting time of the processor is reduced, whereby the performance of the overall processing system can be improved Moreover, the following advantages can be obtained by storing the complementary data in the memory cell MC and reading the complementary data onto the bit lines (normal bit lines or refresh bit lines).

Figure 2:
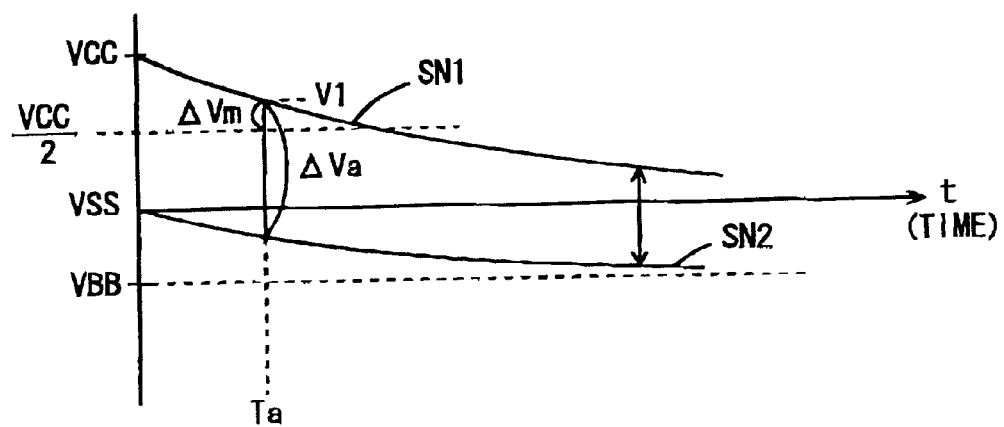
FIG. 2 is a diagram schematically showing a charge retention characteristics of the memory cells shown in FIG. 1.

FIG. 2 is a diagram schematically showing a change over time in voltage at the storage nodes SN1 and SN2 of the memory cell shown in FIG. 1. FIG. 2 shows a change in voltage in the case where H-level data is stored in the storage node SN1 and L-level data is stored in the storage node SN2. The storage node SN1 is at the power supply voltage VCC level right after the refresh operation is completed or the data is written thereto. The voltage level at the storage node SN1 falls exponentially due to a leak current, On the other hand, the storage node SN2 is at the ground voltage VSS level right after the data is rewritten or written thereto. In the case where the substrate region is biased to a negative voltage VBB level, the voltage level at the storage node SN2 also falls exponentially toward the negative voltage VBB.

Herein, the sense margin limit is the voltage at the storage node SN1 falling to V1 at time Ta. An erroneous sensing operation results if the read voltage falls beyond V1 Conventionally, the refresh operation must therefore be performed at time intervals shorter than the time Ta A read voltage limit value $\Delta Vm$ is defined by V1—(VCC/2). Conventionally, only the storage node SN1 is connected to the bit line BL, and the complementary bit line /BL is kept at the precharge voltage VBL (=VCC/2). Therefore, a read voltage $\Delta V$ equal to or larger than the read voltage limit value $\Delta Vm$ is differentially amplified.

In Embodiment 1, however, both storage nodes SN1 and SN2 are simultaneously coupled to the respective bit lines BL and /BL. Accordingly, the voltage difference between the bit lines BL and /BL, $\Delta Va$, is sufficiently larger than the read voltage limit value $\Delta Vm$ even if the read voltage $\Delta V$ on one bit line is equal to the read voltage limit value. Accordingly, the data sensing operation can be accurately performed even if the memory cell data is read at time Ta. In other words, the refresh interval can be significantly increased as compared to the conventional examples, whereby current consumption of the refresh operation performed in the data retention mode or the like can be significantly reduced.

Accordingly, the structure of Embodiment 1 can be used also in applications requiring a low standby current such as portable equipment, In particular, even if the voltage level at the storage node SN1 falls beyond the intermediate voltage VCC/2, a sufficient voltage difference is present between the bit lines, and therefore the sensing operation can be performed accurately. The voltage difference between these normal bit lines BL and /BL is present until the voltage level at the storage node SN1 falls to the ground voltage VSS level Accordingly, the data retention characteristics can be significantly improved over the conventional structures, and thus the number of times of the refresh operation and therefore the data retention current can be reduced.

Figure 3:
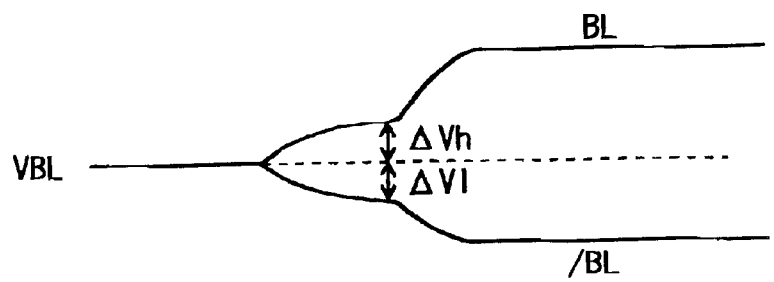
FIG. 3 is a diagram showing a read voltage of the memory cells shown in FIG. 1.

FIG. 3 is a diagram schematically showing voltage waveforms of the normal bit lines BL and /BL in the data read operation. FIG. 3 shows the signal waveforms in the case where E-level data is read onto the normal bit line BL. The voltage levels on the normal bit lines BL and /BL that have been precharged to the intermediate voltage VBL are changed in response to memory cell selection. The voltage level on the bit line BL rises from the intermediate voltage VBL by a voltage $\Delta Vh$, whereas the voltage level on the normal bit line /BL falls from the intermediate voltage VBL by a voltage $\Delta V1$. Since the sense amplifier differentially amplifies the voltages on the bit lines BL and /BL, the voltage difference $\Delta Vh+\Delta V1$ is applied to the sense amplifier. Conventionally, the sense amplifier differentially amplifies a voltage $\Delta Vh$ or $\Delta V1$. Accordingly, the read voltage that is approximately twice that of the conventional structures can be applied to the sense amplifier. Thus, even if the read voltage is reduced clue to the dimensional reduction of the elements, the operation margin of the sense amplifier can be significantly improved, whereby the sensing operation can be performed accurately. Moreover, with the same sense margin as that of the conventional examples, the sensing operation can be started at a faster timing, whereby the high-speed access can be implemented.

Figure 4:
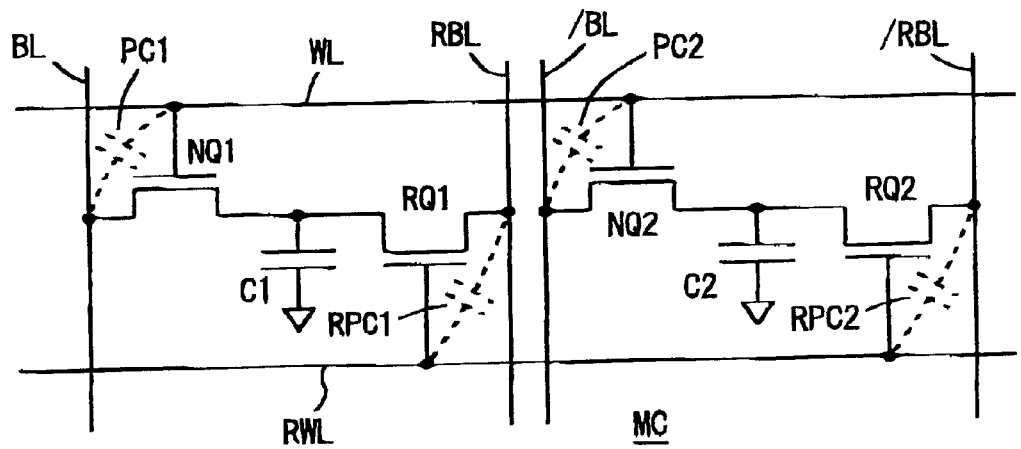
FIG. 4 is a diagram schematically showing gate capacitances of the memory cells shown in FIG. 1.
Figure 5:
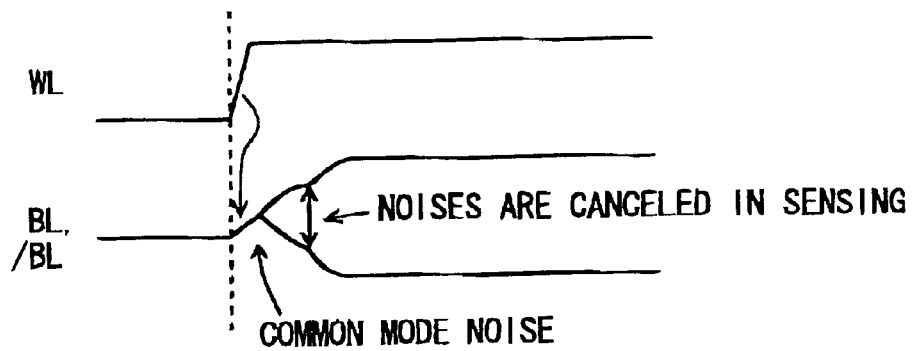
FIG. 5 is a signal waveform diagram representing the data read operation of the structure shown in FIG. 4.

FIG. 4 is a diagram showing the structure of the memory cell MC. As shown in FIG. 4, in the memory cell MC, gate capacitances PC1 and PC2 are present at the access transistors NQ1 and NQ2, and gate capacitances RPC1 and RPC2 are present at the refresh transistors RQ1 and RQ2, respectively. In the case where the voltage level on the normal word line WL rises in selection of the normal word line WL, the voltage levels on the normal bit lines BL and /BL are changed due to capacitive coupling through the gate capacitances PC1 and PC2 In this case, as shown in FIG. 5, common mode noises appear on the bit lines BL and /BL due to the gate capacitances PC1 and PC2, and are superimposed on the data read from the memory cell MC. Accordingly, the memory cell data having the common mode noise superimposed thereon is read onto the normal bit lines BL and /BL, and the sensing operation is performed. In this sensing operation, the voltages on the normal bit lines BL and /BL are differentially amplified. Therefore, the noises are canceled, and an accurate sensing operation can be implemented.

When the word line is driven to the non-selected state, the voltage levels on the normal bit lines BL and /BL have been latched by the sense amplifier circuit, and therefore such a change in voltage level of the word line WL is prevented from adversely affecting the memory cell data.

The gate capacitances RPC1 and RPC2 of the refresh transistors RQ1 and RQ2 also produce common mode noises on the refresh bit lines RBL and /RBL in selection of the refresh word line RWL. Accordingly, in the refresh operation as well, the common mode noises are cancelled by the refresh sense amplifier, whereby the memory cell data can be refreshed accurately.

In other words, by ensuring that complementary data is read onto a bit line pair, the read voltage can be increased, as well as common mode noise due to the gate capacitances (parasitic capacitances) of the transistors can be produced on the bit line pair in selection of the word line. Therefore, these common mode noises can be cancelled in the sensing operation. As a result, dummy word lines or the like need not be provided for noise cancellation, and also the dummy word lines need not be switched between a dummy word line for an even word line and a dummy word line for an odd word line according to the address of the selected word line. Thus, the control is simplified.

As has been described above, according to Embodiment 1 of the present invention, the complementary data are read onto the normal or refresh bit lines, respectively Therefore, the data retention time is increased, and the number of times of the refresh operation can be reduced, whereby a current required for data retention can be reduced Moreover, since the common mode noise is produced on the bit line pair, the noise margin in the sensing operation can be increased, whereby a stable sensing operation can be assured.

Figure 6:
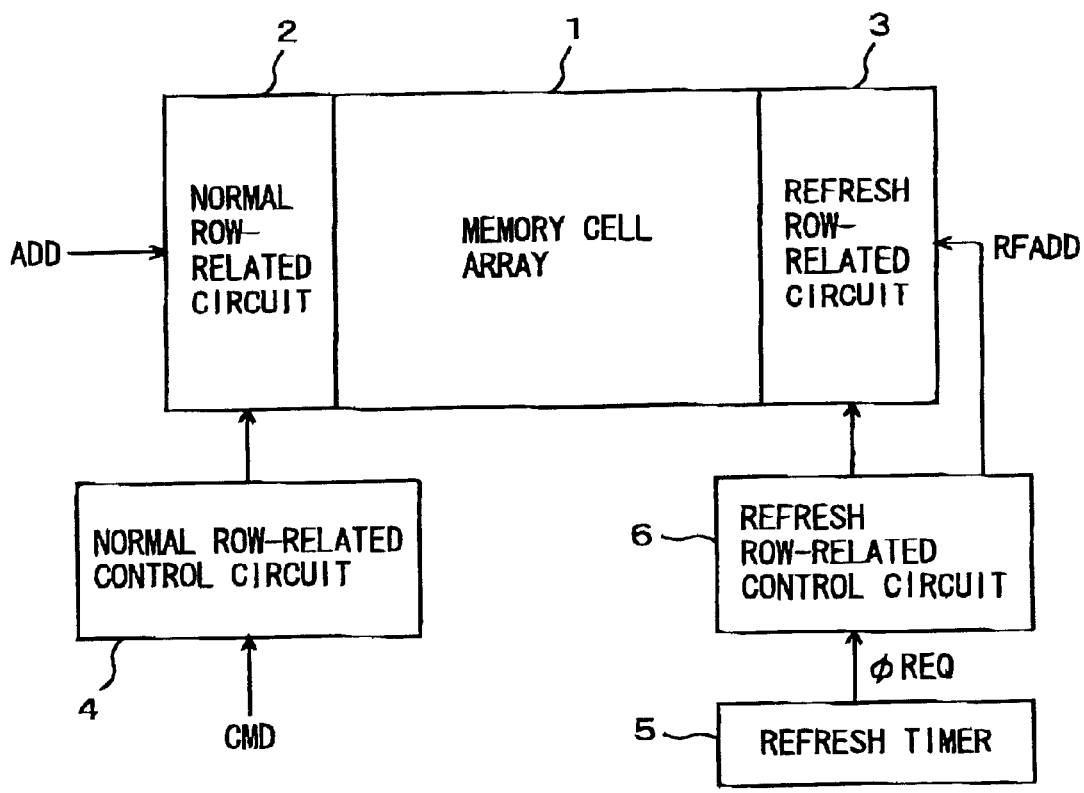
FIG. 6 is a diagram schematically showing the overall structure of the semiconductor memory device according to Embodiment 1 of the present invention.

FIG. 6 is a diagram schematically showing the overall structure of a semiconductor memory device according to the present invention. In FIG. 6, the semiconductor memory device includes a memory cell array 1 having a plurality of memory cells arranged in rows and columns, a normal row-related circuit 2 for selecting a normal word line corresponding to an addressed row of the memory cell array 1 according to an external address signal ADD, a refresh row-related circuit 3 for selecting a refresh word line corresponding to a refresh row of the memory cell array 1, a normal row-related control circuit 4 for controlling the operation of the normal row-related circuit 2 according to an external operation mode instruction signal (or command) CMD, a refresh timer 5 for producing a refresh request signal φREQ at constant intervals, and a refresh row-related control circuit 6 for producing a refresh row address RFADD according to the refresh request signal φREQ issued from the refresh timer 5, applying the refresh row address RFADD to the refresh row-related circuit 3, and controlling the operation of the refresh row-related circuit 3.

The normal row-related circuit 2 includes a normal bit line equalizing/precharging circuit, a normal sense amplifier, a row address input buffer, a row address decoding circuit, and a word line driving circuit. Similarly, the refresh row-related circuit 3 includes a refresh bit line equalizing/precharging circuit, a refresh sense amplifiers a refresh address decoding circuit, a refresh word line driving circuit, and the like.

In the structure shown in FIG. 6, the refresh row-related control circuit 6 operates in response to the refresh request signal φREQ issued from the refresh timer 5, whereas the normal row-related control circuit 4 operates according to the external operation mode instruction signal (or command) CMD. Accordingly, the normal row-related circuit 2 and refresh row-related circuit 3 operate independently of each other, and respectively select an addressed normal word line and an addressed refresh word line in the memory cell array 1. Since the refresh bit lines and normal bit lines are separately provided in the memory cell array 1, data conflict does not occur on the bit lines, and the normal row-related control circuit 4 controls the normal row-related circuit 2 independently of the operation of the refresh row-related control circuit 6 so as to select a normal word line in the memory cell array 1 according to the external address signal ADD. Therefore, the external access can be made without consideration of the internal refresh operation.

Embodiment 2

Figure 7:
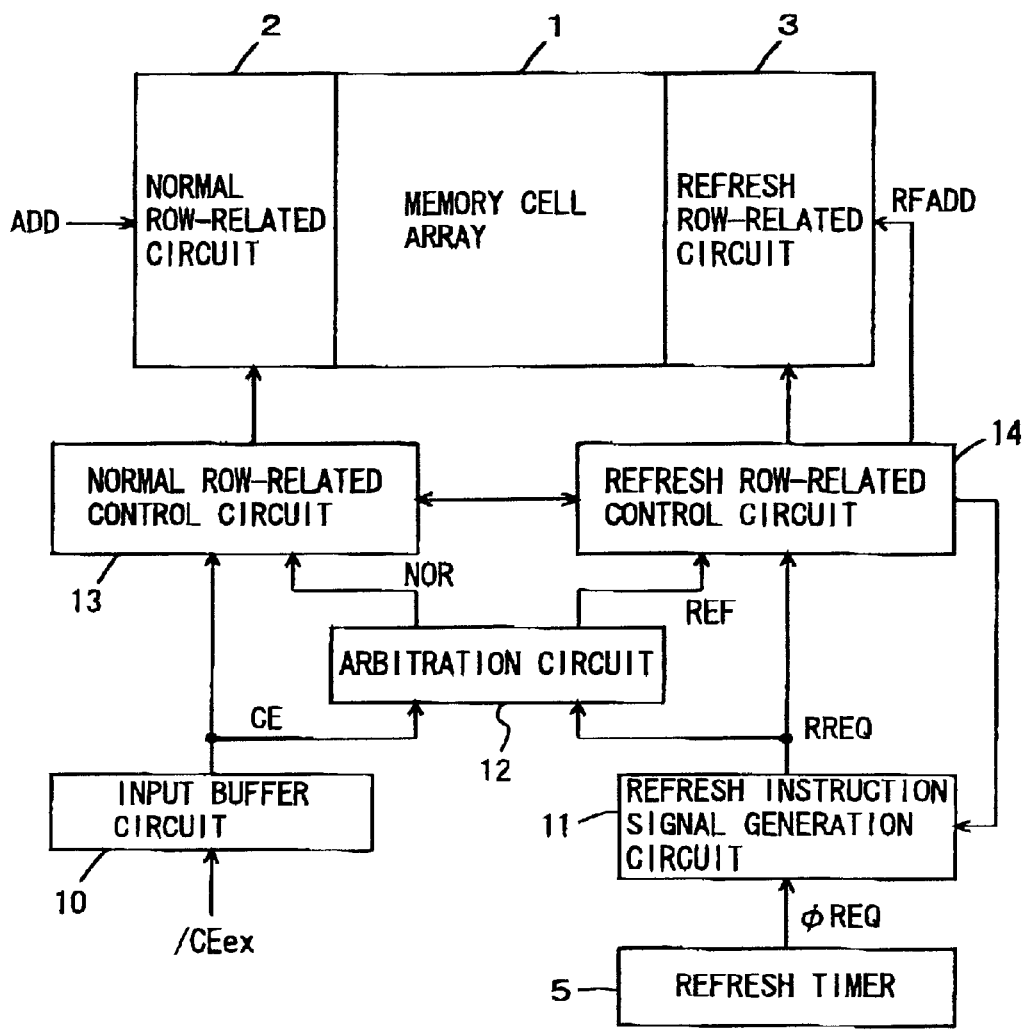
FIG. 7 is a diagram schematically showing the overall structure of a semiconductor memory device according to Embodiment 2 of the present invention.

FIG. 7 is a diagram schematically showing the overall structure of a semiconductor memory device according to Embodiment 2 of the present invention. In FIG. 7, like Embodiment 1, a memory cell array 1, normal row-related circuit 2 and refresh row-related circuit 3 are provided. In the memory cell array 1, memory cells are arranged corresponding to the respective intersections of bit line pairs and word lines, and the complementary data stored in the memory cell is transmitted to the bit line pair. The normal row-related circuit 2 and refresh row-related circuit 3 each includes a sense amplifier, a bit line precharge/equalize circuit, a row address decoder, and a word line driving circuit.

This semiconductor memory device further includes an input buffer circuit 10 for receiving an external chip enable signal /CEex to produce an internal chip enable signal (memory cell selection instruction signal) CE, a refresh timer 5 for generating a refresh request signal φREQ at predetermined time intervals, a refresh instruction signal generation circuit 11 for producing a refresh instruction signal φREQ in response to activation of the refresh request signal φREQ, and an arbitration circuit 12 for activating one of a normal row-related control circuit 13 and refresh row-related control circuit 14 according to the internal chip enable signal CE and refresh instruction signal RREQ.

This arbitration circuit 12 activates a row selection operation instruction signal for one of the normal row-related control circuit 13 and refresh row-related control circuit 14, according to which one of the chip enable signal CE and refresh instruction signal RREQ was activated at earlier timing. In the case where the internal chip enable signal CE was activated earlier, the arbitration circuit 12 activates a normal row activation signal NOR and applies it to the normal row-related control circuit 13. In the case where the refresh instruction signal RREQ was activated earlier, the arbitration circuit 12 activates a refresh activation signal REF and applies it to the refresh row-related control circuit 14 The refresh instruction signal RREQ is activated in response to generation of the refresh request signal φREQ, and deactivated when the refresh operation is completed in the refresh row-related control circuit 14.

When the refresh operation and normal row access overlap each other, the normal row-related control circuit 13 and refresh row-related control circuit 14 each enable the other row-related control circuit after each respective sensing operation is completed. The normal row-related control circuit 13 is enabled in response to activation of the internal chip enable signal CE, and is selectively activated under the control of the arbitration circuit 12 to generate a normal row control signal. The refresh row-related control circuit 14 is enabled in response to activation of the refresh instruction signal RREQ, and is selectively activated under the control of the arbitration circuit 12, Now, the operation of each portion will be described.

Figure 8:
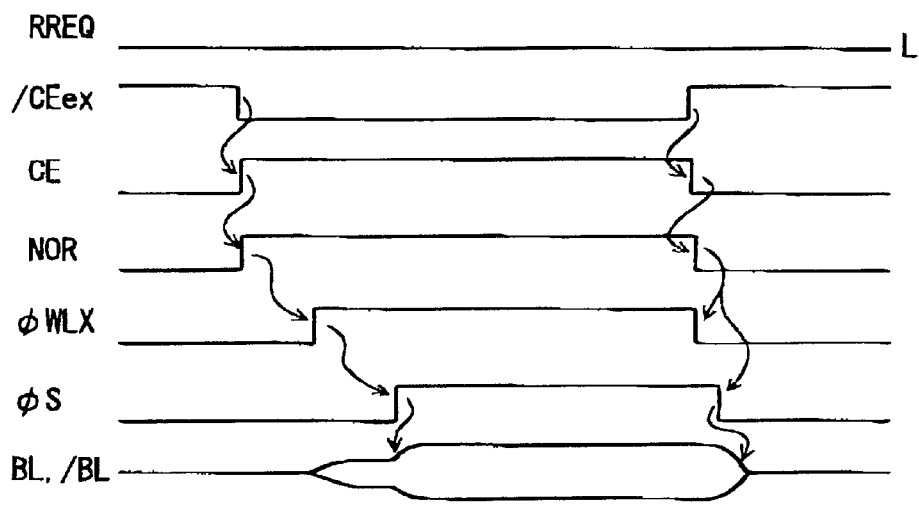
FIG. 8 is a signal waveform chart representing the operation of the semiconductor memory device shown in FIG. 7.

FIG. 8 is a diagram showing signal waveforms in the normal access operation. In FIG. 8, the refresh instruction signal RREQ is held inactive at L level. When the external chip enable signal /CEex falls to L level, the input buffer circuit 10 raises the internal chip enable signal CE to H level. Since the refresh instruction signal RREQ is at L level, the arbitration circuit 12 activates the normal row activation signal NOR and applies it to the normal row-related control circuit 13, The normal row-related control circuit 13 sequentially activates a word line drive timing signal φWLX and sense amplifier activation signal φS according to the internal chip enable signal CE and normal row activation signal NOR, and applies them to the normal row-related circuit 2. By the operation of the normal row-related circuit 2, complementary data is read from the memory cells on a selected word line onto the bit lines BL and /BL, according to the word line drive timing signal φWLX. Then, the voltages on the bit lines BL and /BL are differentially amplified according to activation of the sense amplifier activation signal φS.

When the external chip enable signal /CEex rises to H level, the access cycle is completed, and the internal chip enable signal CE is deactivated. Accordingly, the arbitration circuit 12 drives the normal row activation signal NOR to the inactive state at L level Responsively, the word line drive timing signal φWLX and sense amplifier activation signal φS are deactivated, and the bit lines BL and /BL are returned to the origin al precharge state.

In this semiconductor memory device, the chip enable signal /CEex is used to control data access to the memory cells This semiconductor memory device is used as pseudo SRAM, latches an address signal according to the chip enable signal /CEex, and sequentially internally performs row and column selection according to the row and column addresses, for data access.

Figure 9:
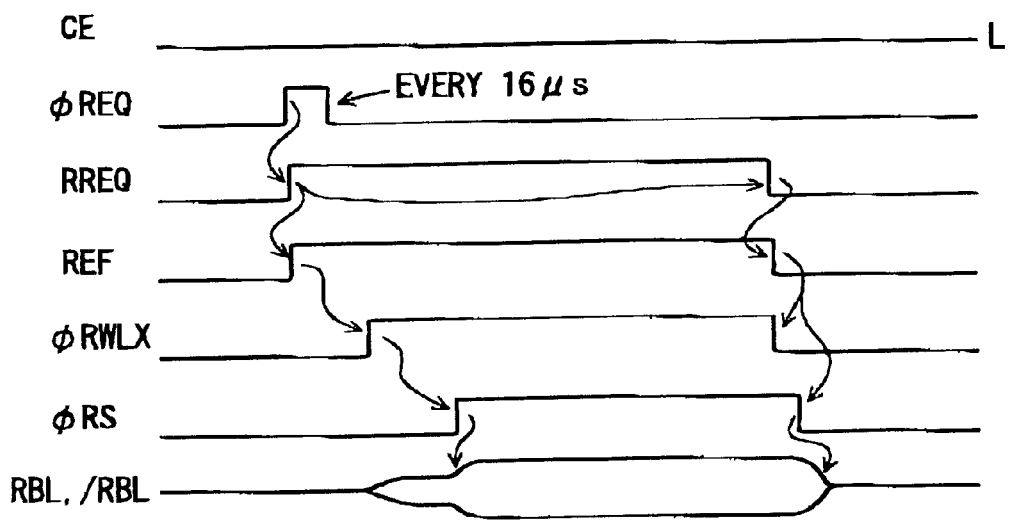
FIG. 9 is a signal waveform diagram representing the refresh operation of the semiconductor memory device shown in FIG. 7.

FIG. 9 is a signal waveform diagram representing the refresh operation in the standby state (data retention mode or normal operation mode). In this standby state, the internal chip enable signal CE is in the inactive state at L level. The refresh timer 5 activates the refresh request signal φREQ at predetermined time intervals (e.g., 16 μs). According to this refresh request signal φREQ, the refresh instruction signal generation circuit 11 activates the refresh instruction signal RREQ. Since the internal chip enable signal CE is inactive, the arbitration circuit 12 activates the refresh activation signal REF in response to activation of the refresh instruction signal RREQ, to the refresh row-related control circuit 14.

The refresh row-related control circuit 14 sequentially activates a refresh word line drive timing signal φRWLX and refresh sense amplifier activation signal φRS according to activation of the refresh instruction signal RREQ and refresh activation signal REF. Accordingly, the memory cell data is read onto the refresh bit lines RBL and /RBL for restoring. The refresh instruction signal RREQ falls to L level after a predetermined time from activation of the refresh sense amplifier activation signal φRS. Responsively, the refresh activation signal REF is deactivated, and the refresh word line drive timing signal φRWLX and refresh sense amplifier activation signal φRS are deactivated, whereby the refresh bit lines RBL and /RBL are returned to the original intermediate voltage level.

The following advantages can be provided by activating a row selection instruction signal only for one of the normal row-related control circuit 13 and refresh row-related control circuit 14 by means of the arbitration circuit 12.

Figure 10:
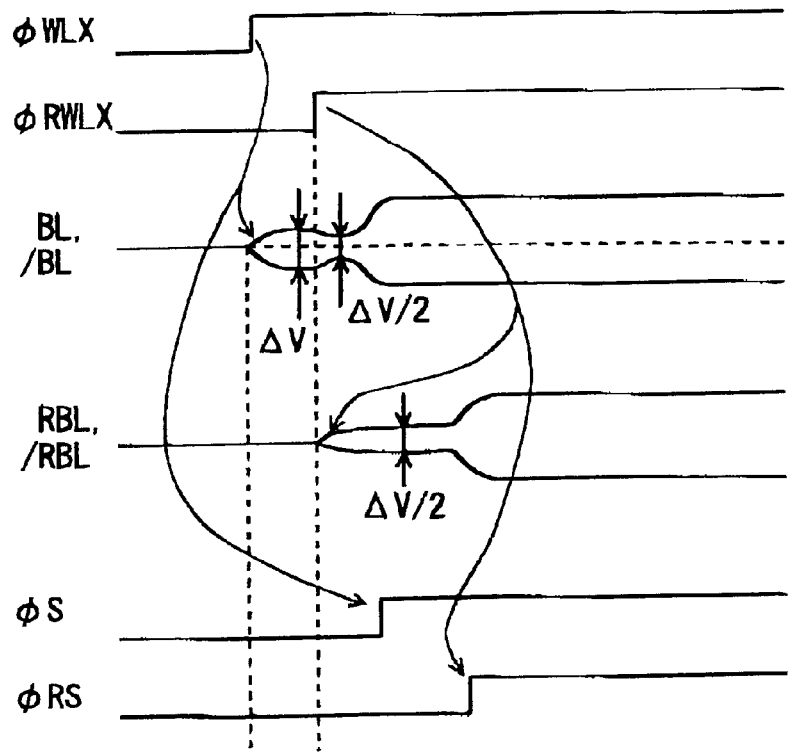
FIG. 10 is a signal waveform diagram representing the operation upon simultaneously performing the refresh operation and data access in the semiconductor memory device shown in FIG. 7.

It is now assumed that the external data access is first started and the refresh operation is performed thereafter, as shown in FIG. 10 In this case, the normal word line drive timing signal φWLX is first driven to the selected state, and the stored memory cell data is transmitted onto the normal bit lines BL and /BL. In other words, charges accumulated in the capacitors C1 and C2 are transmitted onto the bit lines BL and /BL. It is herein assumed that the voltage difference between the normal bit lines BL and /BL is ΔV.

Subsequently, the refresh word line drive timing signal φRWLX is driven to the selected state. In the case where the same row is selected and the memory cell MC1 is selected for refresh, charges accumulated in the capacitors C1 and C2 are transmitted onto the refresh bit lines RBL and /RBL. The charges accumulated in the capacitors C1 and C2 of the memory cell MC1 have already been transmitted onto the normal bit lines BL and /BL. Therefore, these charges are moved again. This is equivalent to the state where the charges accumulated in the capacitor C1 are transmitted onto the bit lines BL and RBL and the charges accumulated in the capacitor C2 are read onto the bit lines /BL and /RBL. Accordingly, in this case, the voltage difference between the normal bit lines BL and /BL is approximately halved, whereby the read voltage becomes ΔV/2. In the refresh bit line pair RBL and /RBL as well, the read voltage is ΔV/2.

Accordingly, even if the complementary data is stored and read onto the bit line pair so as to effectively increase the read voltage, the read voltage on the bit lines is reduced and thus the sense margin is reduced provided that the data access and the refresh operation are performed to the same row. Accordingly, the advantages of reading the complementary data are impaired, and the data retention characteristics is degraded, thereby possibly hindering accurate data access and refresh operation. Accordingly, by first activating only one of the data access and the refresh operation with the arbitration circuit 12 shown in FIG. 7, the sensing operation is accurately performed with the read voltage ΔV even if the same row is selected for the data access and refresh operation.

FIG. 11 is a signal waveform diagram representing the operation of the arbitration circuit 12 shown in FIG. 7. In FIG. 11, in the case where the internal chip enable signal CE was activated earlier than the refresh instruction signal RREQ, the arbitration circuit 12 activates the normal row activation signal NOR, and keeps the refresh activation signal REF inactive even if the refresh instruction signal RREQ is activated Accordingly, in this case, the normal row-related control circuit 13 fist performs a row selection operation.

On the other hand, in the case were the refresh instruction signal RREQ was activated earlier than the internal chip enable signal CE, the arbitration circuit 12 activates the refresh activation signal REF according to the refresh instruction signal RREQ The arbitration circuit 12 keeps the normal row selection activation signal NOR inactive even if the internal chip enable signal CE is activated.

In other words, the arbitration circuit 12 activates one of the normal row activation signal NOR and refresh activation signal REF according to the timing relation between the internal chip enable signal CE and refresh instruction signal RREQ When one of the row-related circuits is operated and the sensing operation is completed, then the other row-related circuit is activated to perform a row selection operation Now, each circuit structure will be described.

Structure of Refresh Timer

FIG. 12 is a diagram schematically showing the structure of the refresh timer 5 shown in FIG. 7 In FIG. 12, the refresh timer 5 includes a ring oscillator 5a responsive to supply of the power supply voltage VCC for oscillating to produce an oscillation signal OSC, a counter 5b for counting the oscillation signal OSC from the ring oscillator 5a, and a one-shot pulse generation circuit 5c for generating a one-shot pulse signal according to a count-up instruction signal φUP from the counter 5b. This one-shot pulse generation circuit 5c generates the refresh request signal φREQ in a one-shot pulse form.

The counter 5b counts the oscillation signal OSC from the ring oscillator 5a, and activates the count-up instruction signal φUP when the counter 5b counts a predetermined number of oscillation signals that is determined by the oscillation cycle of the ring oscillator (e.g., the number corresponding to the period of 16 μs). The one-shot pulse generation circuit 5c produces the refresh request signal φREQ according to this count-up instruction signal φUP Accordingly, the refresh request signal φREQ is generated upon counting-up of the counter 5b.

Note that the counter 5b may be provided with a frequency-dividing circuit for dividing the frequency of the oscillation signal OSC from the ring oscillator 5a. Moreover, the counter 5b may generate the count-up instruction signal φUP when the count value is returned from its maximum value to the initial value. Alternatively, the counter 5b may produce the count-up signal φUP when the count value reaches a predetermined value at an intermediate value in the countable range of the counter 5b, so as to reset this count value to the initial value according to the count-up signal φUP.

Structure of Refresh Instruction Signal Generation Circuit

FIG. 13 is a diagram schematically showing the structure of the refresh instruction signal generation circuit 11 shown in FIG. 7. In FIG. 11, the refresh instruction signal generation circuit 11 includes a one-shot pulse generation circuit 11a for generating a one-shot pulse signal in response to activation of the refresh request signal φREQ. This one-shot pulse generation circuit 11a outputs the refresh instruction signal RREQ. The refresh instruction signal RREQ is held active until the memory cell data refresh (restoring) is completed through the operation of the refresh sense amplifier circuit in response to the refresh instruction.

Modification of Refresh Instruction Signal Generation Circuit

FIG. 14 is a diagram showing the structure of a modification of the refresh instruction signal generation circuit 11 shown in FIG. 7. In FIG. 14, the refresh instruction signal generation circuit 11 includes a delay circuit 11b for delaying the refresh sense amplifier activation signal φRS by a predetermined time, and a set/reset flip flop 11c being set in response to activation of the refresh request signal φREQ and reset in response to an output signal of the delay circuit 11b, for generating the refresh instruction signal RREQ from its output Q.

In the structure shown in FIG. 14, the refresh instruction signal RREQ is driven to the inactive state after the memory cell data refresh is performed through the operation of the refresh sense amplifier. Thus, even if there is variation in manufacturing parameters, the refresh instruction signal RREQ can be accurately reset after the memory cell data refresh is completed.

Note that, in the case where the refresh request signal and internal chip enable signal are activated in parallel, the arbitration circuit 12 first activates one of the row control-related circuits that corresponds to the earlier-activated signal, and then activates the other row-related control circuit, Accordingly, one of the normal access and the refresh operation that is instructed earlier is first performed, and then the operation instructed later is performed. Therefore, even if one of the refresh activation signal REF and normal row activation signal NOR is held inactive, the refresh operation is performed when the refresh request is applied. Accordingly, the refresh sense amplifier activation signal φRS is activated even if the normal access and the refresh operation overlap each other. Therefore, it is possible to activate the refresh instruction signal RREQ in accordance with the refresh request signal φREQ, and then deactivate the refresh instruction signal RREQ after the refresh operation is completed This operation scheme prevents the refresh operation from being skipped for a single refresh period, thereby reliably holding the memory cell data.

Structure of Arbitration Circuit

Figure 15:
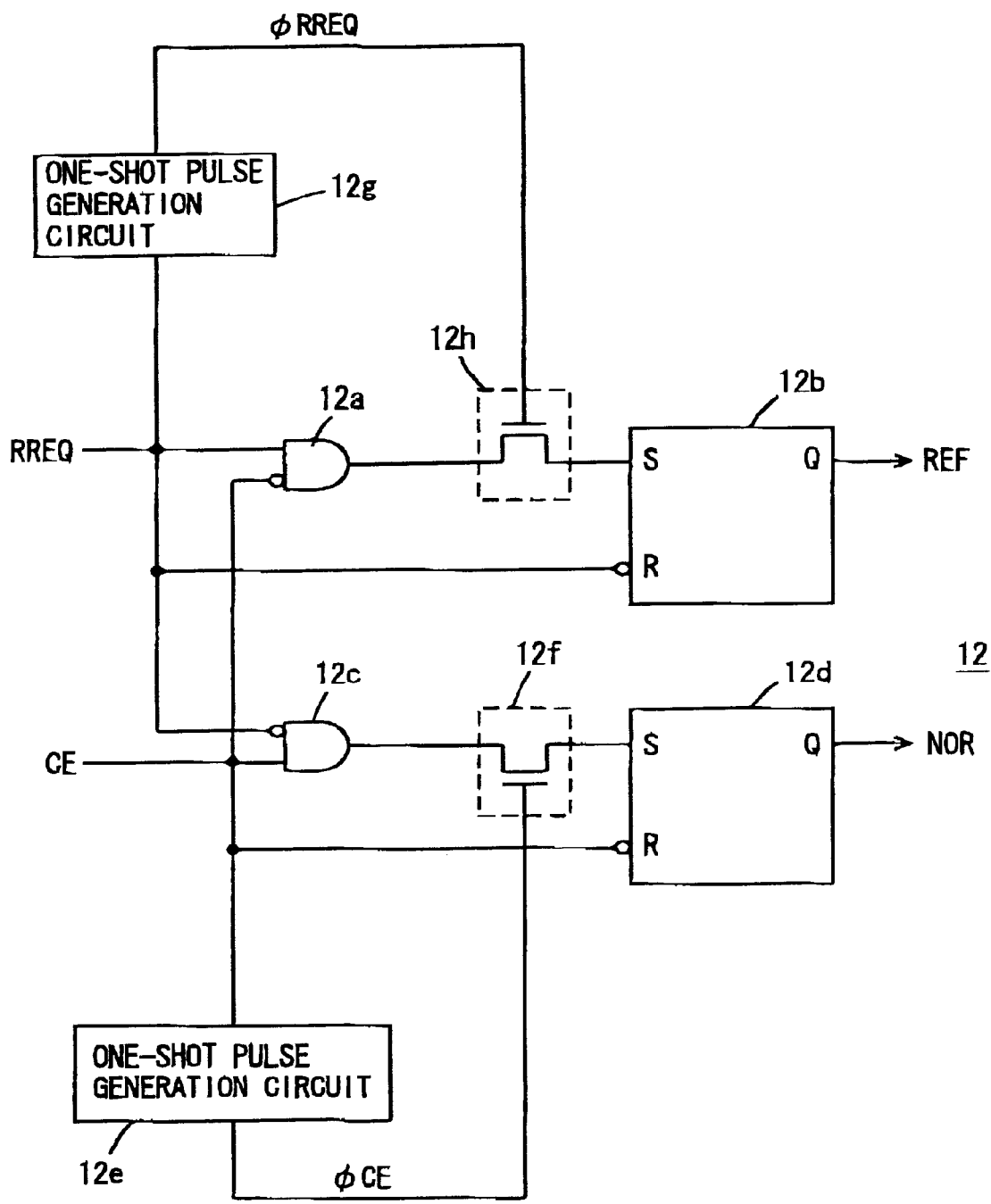
FIG. 15 is a diagram schematically showing the structure of the arbitration circuit shown in FIG. 7.

FIG. 15 is a diagram schematically showing the structure of the arbitration circuit 12 shown in FIG. 7. In FIG. 15, the arbitration circuit 12 includes a gate circuit 12a receiving the refresh instruction signal RREQ and internal chip enable signal CE, a one-shot pulse generation circuit 12g for generating a one-shot pulse signal φRREQ in response to the rise of the refresh instruction signal RRFQ, a transfer gate 12h for passing an output signal of the gate circuit 12a therethrough in response to the one-shot pulse signal φRREQ, a set/reset flip flop 12b being set in response to the rise of the signal from the transfer gate 12h and reset in response to the fall of the refresh instruction signal RREQ, a gate circuit 12c receiving the refresh instruction signal RREQ and internal chip enable signal CE, a one-shot pulse generation circuit 12e for producing a one-shot pulse signal φCE in response to the rise of the internal chip enable signal CE, a transfer gate 12f for passing an output signal of the gate circuit 12c therethrough in response to the one-shot pulse signal φCE, and a set/reset flip flop 12d being set in response to the rise of the signal from the transfer gate 12f and reset in response to the fall of the internal chip enable signal CE.

The gate circuit 12a outputs an H-level signal when the refresh instruction signal RREQ is at H level as well as the internal chip enable signal CE is at L level. The gate circuit 12c outputs an H-level signal when the refresh instruction signal RREQ is at L level as well as the internal chip enable signal CE is at H level. The refresh activation signal REF is output from the flip flop 12b and the normal row activation signal NOR is output from the set/reset flip flop 12d.

The gate circuit 12a detects that the refresh instruction signal RREQ was activated earlier than the internal chip enable signal CB, and the gate circuit 12c detects that the internal chip enable signal CE was activated earlier than the refresh instruction signal RREQ. If the output signal of the gate circuit 12a is at L level while the transfer gate 12h is conductive, the set/reset flip flop 12b is kept in the reset state. If the output signal of the gate circuit 12c is at L level while the transfer gate 12f is conductive, the set/reset flip flop 12d is kept in the reset state.

Accordingly, in this arbitration circuit 12, if the internal chip enable signal CE is activated earlier, the gate circuit 12a is disabled and the refresh activation signal REF is kept at L level even if the refresh instruction signal RREQ is generated. On the other hand, if the refresh instruction signal RREQ is activated earlier, the gate circuit 12c is disabled. Therefore, the normal row activation signal NOR is kept inactive even if the internal chip enable signal CE is generated. This structure of the arbitration circuit 12 enables an operation activation signal to be applied to the row-related circuit that is activated earlier. As described in detail below, however, regarding the row-related circuits, the other row-related circuit is activated after the sensing operation of the row-related circuit that is activated earlier is completed.

Structure of Row-Related Control Circuit

Figure 16:
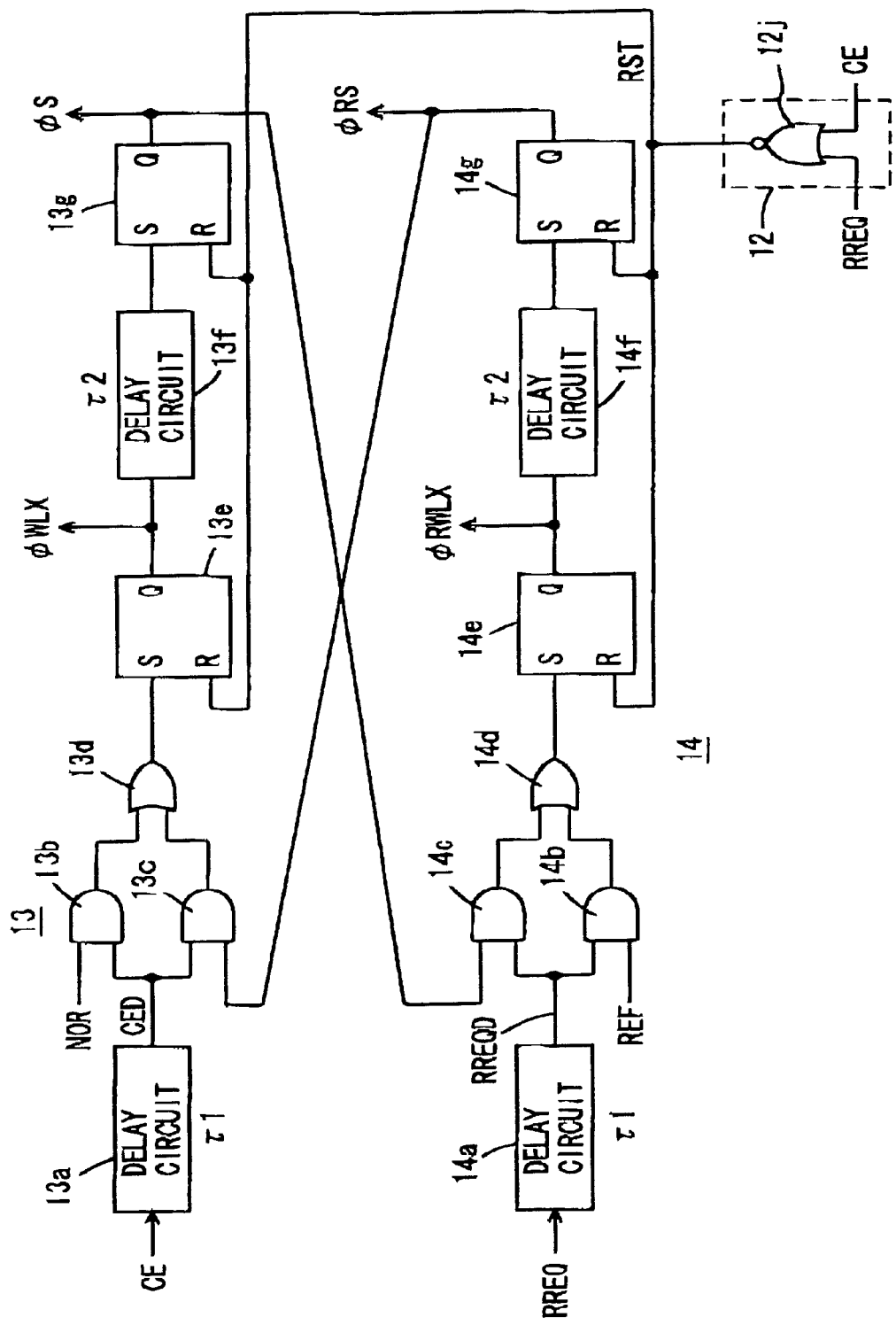
FIG. 16 is a diagram schematically showing the structure of a normal row-related control circuit and refresh rowrelated control circuit shown in FIG. 7.

FIG. 16 is a diagram schematically showing the structure of the row-related control circuits 13 and 14 shown in FIG. 7. In FIG. 16, the normal row-related control circuit 13 includes a delay circuit 13a for delaying the internal chip enable signal CE by a predetermined time 1, an AND circuit 13b receiving the normal row activation signal NOR and an output signal of the delay circuit 13a, an AND circuit 13c receiving the refresh sense amplifier activation signal φRS from the refresh row-related control circuit 14 and the output signal of the delay circuit 13a, an OR circuit 13d receiving output signals of the AND circuits 13b and 13c, a set/reset flip flop 13e being set in response to the rise of an output signal of the OR circuit 13d for producing the normal word line drive timing signal φWLX, a delay circuit 13f for delaying the word line drive timing signal φWLX output from the set/reset flip flop 13e by a predetermined time τ2, and a set/reset flip flop 13g being set in response to the rise of an output signal of the delay circuit 13f for activating the sense amplifier activation signal φS. The word line drive timing signal φWLX is applied to a not-shown row decoder, and the logical operation result of the word line drive timing signal φWLX and a word line decode signal is transmitted onto the selected word line.

The refresh row-related control circuit includes a delay circuit 14a for delaying the refresh instruction signal RREQ by the predetermined time τ1, an AND circuit 14b receiving an output signal of the delay circuit 14a and the refresh activation signal REF, an AND circuit 14c receiving the sense amplifier activation signal φS and the output signal of the delay circuit 14a, an OR circuit 14d receiving output signals of the AND circuits 14b and 14c, a set/reset flip flop 14e being set in response to the rise of an output signal of the OR circuit 14d for activating the refresh word line drive timing signal φRWLX, a delay circuit 14f for delaying the refresh word line drive timing signal φRWLX by the predetermined time τ2, and a set/reset flip flop 14g being set in response to the rise of an output signal of the delay circuit 14f for activating the refresh sense amplifier activation signal φRS.

In addition to the structure shown in FIG. 15, the arbitration circuit 12 further includes a NOR circuit 12j receiving the refresh instruction signal RREQ and internal chip enable signal CE to activate a reset signal RST. When this reset signal RST is activated, the set/reset flip flops 13e, 13g, 14e and 14g are reset, whereby the row-related control circuits 13 and 14 are deactivated, Now, the operation of the row-related control circuits shown in FIG. 16 will be described with reference to the signal waveform chart of FIG. 17.

Figure 17:
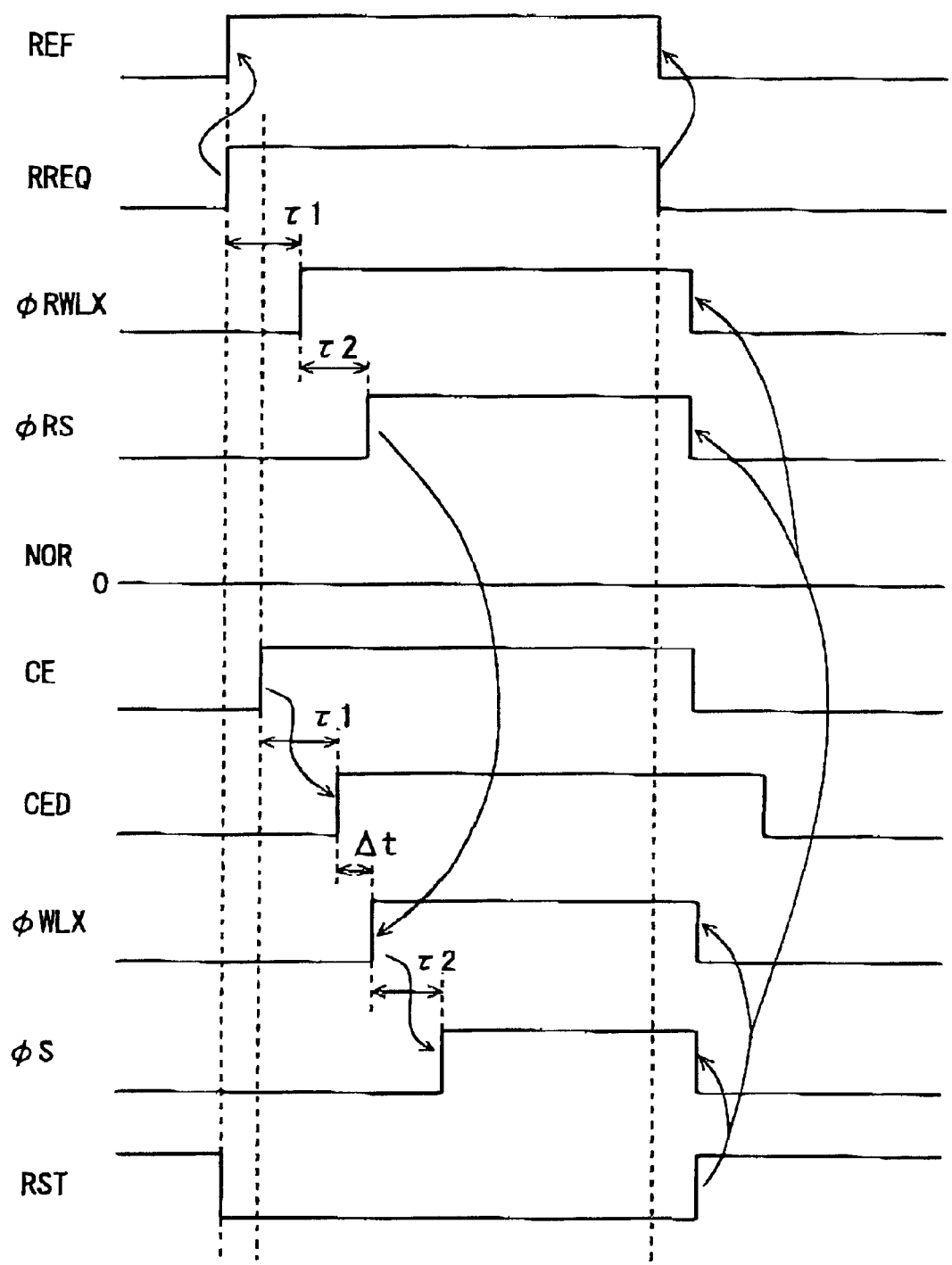
FIG. 17 is a signal waveform diagram representing the operation of the row-related control circuits shown in FIG. 16.

Referring to FIG. 17, the operation performed in the case where the refresh instruction signal RREQ is applied earlier than the internal chip enable signal CE will be described. In this case, as described above, the refresh activation signal REF is activated in response to activation of the refresh instruction signal REEQ, whereas the normal row activation signal NOR is kept at L level. In the refresh row-related control circuit 14, since the refresh activation signal REF is at H level, the output signal of the AND circuit 14b rises to H level in response to the rise of the delayed refresh instruction signal RREQD from the delay circuit 14a to H level. The output signal of the OR circuit 14d is responsively driven to H level. Thus, the set/reset flip flop 14e is set, and the word line drive timing signal φRWLX is driven to H level, whereby a refresh word line is selected.

After an elapse of the delay time τ2 of the delay circuit 14f from the time the refresh word line drive timing signal φRWLX is driven to the active state, the set/reset flip flop 14g is set, whereby the refresh sense amplifier activation signal φRS is activated.

In the normal row-related control circuit 13, even if the internal chip enable signal CE is activated, the output signal of the AND circuit 13c is kept at L level and thus the normal row selection operation is inhibited until the refresh sense amplifier activation signal φRS is activated. When the refresh sense amplifier activation signal φRS is activated, the output signal of the AND circuit 13c rises to H level, and the set/reset flip flop 13e is responsively set by the output signal of the OR circuit 13d. Thus, the normal word line drive timing signal φWLX is activated after the refresh sense amplifier activation signal φRS is activated.

Accordingly, the disadvantageous multiple word line selection, i.e., selection of both normal and refresh word lines before the start of the sensing operation, can be prevented. In other words, after the refresh operation is performed according to the refresh sense amplifier activation signal φRS and the voltages at the power supply voltage VCC and ground voltage VSS levels are written to the memory capacitors, a normal word line at the same row address is driven to the selected state Accordingly, the data stored in the memory cell capacitors is merely transmitted onto the normal bit lines. At this time, a current flows from the refresh sense amplifier to the normal bit lines, whereby the voltage levels on the normal bit lines are significantly changed as compared to the case of the normal read operation of the memory cell data.

When the output signal of the delay circuit 13f then rises to H level, the sense amplifier activation signal φS is activated, and the voltages on the normal bit lines are differentially amplified.

Even if the refresh instruction signal RREQ falls to L level and the refresh operation is completed, the reset signal RST from the NOR circuit 12j is at L level while the internal chip enable signal CE is at H level, and these signals are not reset. Herein, the refresh instruction signal RREQ may be generated in the form of a one-shot pulse of a predetermined time width, or may be reset after a predetermined time from activation of the refresh sense amplifier activation signal φRS.

When the data access is completed and the internal chip enable signal CE falls to L level, the reset signal RST from the NOR circuit 12j rises to H level, and the set/reset flip flops 13e, 13g, 14e and 14g are reset, whereby the normal row-related control circuit 13 and refresh row-related control circuit 14 are returned to the initial state.

In the case where the data access is performed during refresh operation, time τ1+Δt is required until a normal word line is selected from the time the internal chip enable signal CE rises to H level. The time Δt is a period required from the time the output signal CED of the delay circuit 13a rises to H level until the normal word line drive timing signal φWLX is driven to the active state. The time Δt is maximized when the refresh instruction signal RREQ and internal chip enable signal CE are substantially Simultaneously applied, and the maximum time Δtm is equal to time τ2.

Provide that the normal data access is solely performed, the normal word line drive timing signal φWLX is activated when both the delayed chip enable signal CED from the delay circuit 13a and the normal row activation signal NOR are rendered active. Accordingly, the internal operation is delayed by the time Δt as compared to the normal operation. The time required from selection of the word line until activation of the sense amplifier is usually in the range of 10 ns to 15 ns. In the case where the internal chip enable signal CE is properly input, the access time is in the range of 30 ns to 40 ns In view of the above, the cycle time is in the range of 45 ns to 55 ns. The cycletime can be within 70 ns even if the precharge time of 10 ns is included Thus, a high-speed semiconductor memory device capable of accurately performing data access can be realized.

Note that, the operation waveforms in the case where the internal chip enable signal CE is first activated and the refresh instruction signal RREQ is subsequently activated can be obtained by exchanging the signals for refresh operation and the signals for normal word selection in FIG. 17.

As has been described above, according to Embodiment 2 of the present invention, in the case where the normal access and the refresh operation are performed in parallel, the other row-related circuit is activated after the row selection operation activation signal applied at earlier timing is rendered active and the operation of the sense amplifier in the corresponding row-related circuit is completed, Therefore, the normal and refresh word lines at the same address are not simultaneously selected before sensing operation. Thus, reduction in read voltage on the bit lines and therefore in sense margin can be prevented In addition, degradation in data retention characteristics can be prevented.

Embodiment 3

Figure 18:
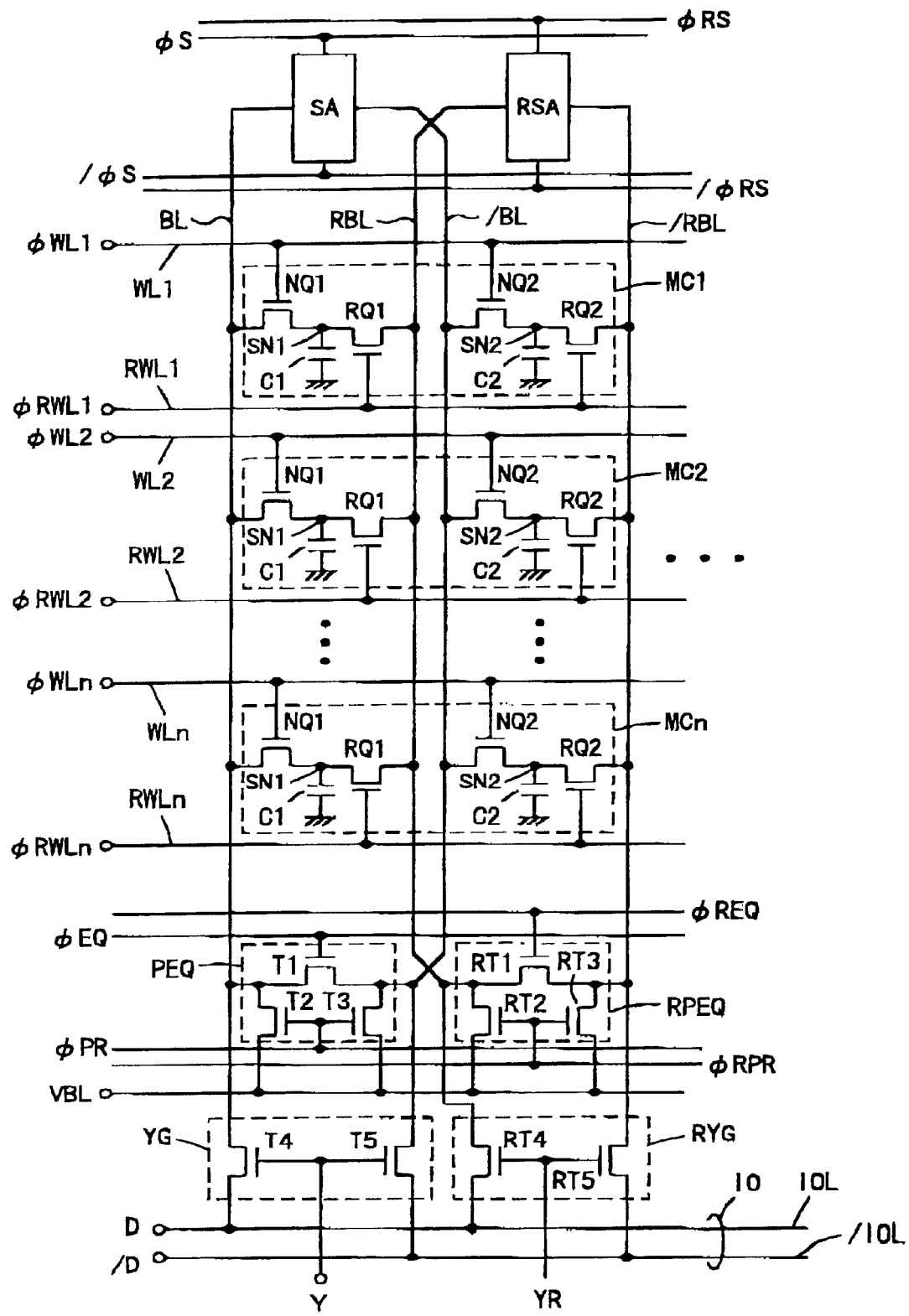
FIG. 18 is a diagram showing the structure of an array portion of a semiconductor memory device according to Embodiment 3 of the present invention.

FIG. 18 is a diagram showing the structure of a memory array portion of a semiconductor memory device according to Embodiment 3 of the present invention. In the structure shown in FIG. 18, a refresh column selection gate RYG is provided for the refresh bit lines RBL and /RBL. This refresh column selection gate RYG couples the refresh bit lines RBL and /RBL to the respective internal data lines IOL and /IOL according to a refresh column selection signal YR. The refresh column selection gate RYG includes N-channel MOS transistors RT4 and RT5 rendered conductive in response to the refresh column selection signal YR, for connecting the refresh bit lines RBL and /RBL to the internal data lines IOL and /IOL respectively.

In the structure shown in FIG. 18, when the refresh operation and the normal data access are performed to the same row in parallel, the column selection gate corresponding to the operation mode activated earlier is driven to the conductive state More specifically, if the normal access operation is designated earlier, the column selection gate YG is selected. If the refresh operation is designated earlier, the refresh column selection gate RYG is selected. Thus, in the case where the refresh operation and the normal data access are sequentially performed to the same row in this order, it is not necessary to wait for the refresh operation to be completed As a result, fast access can be realized.

Now, the structure of a portion for generating the column selection signals Y and YR will be described.

Figure 19:
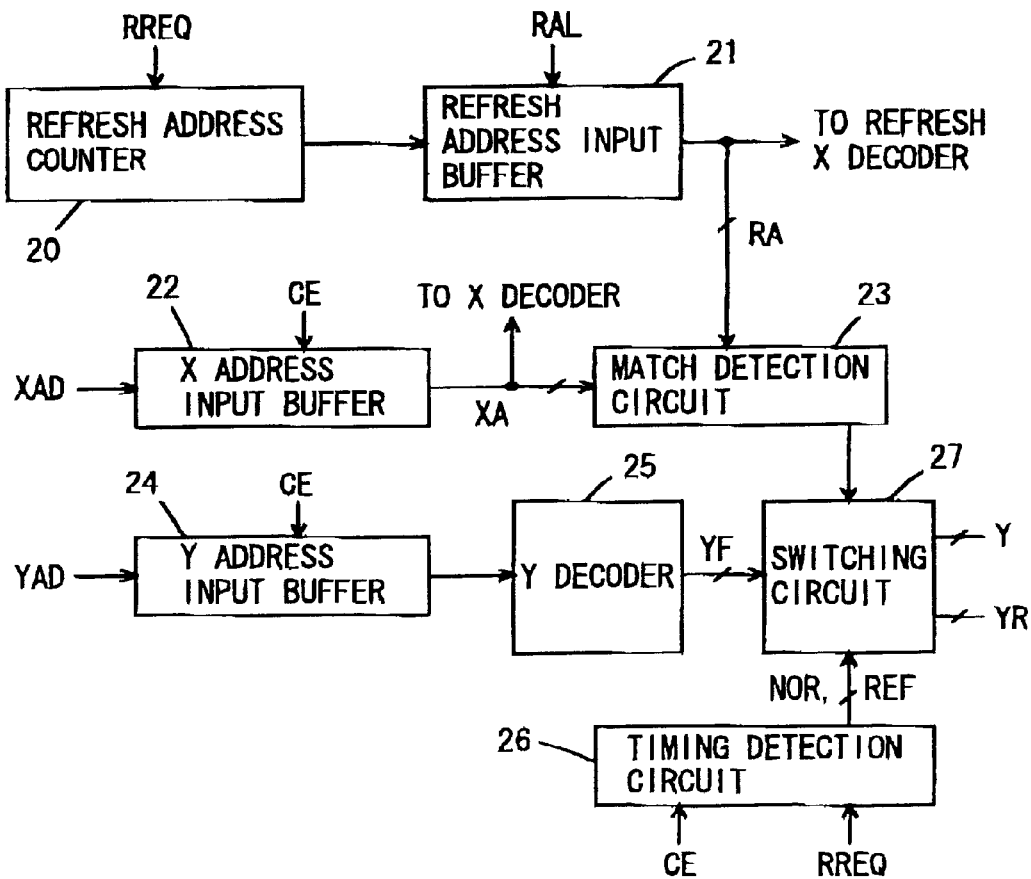
FIG. 19 is a diagram schematically showing the structure of a main portion of the semiconductor memory device according to Embodiment 3 of the present invention.

FIG. 19 is a diagram schematically showing the structure of a Y address control portion of the semiconductor memory device according to Embodiment 3 of the present invention. In FIG. 19, the Y address control portion includes a refresh address counter 20 responsive to deactivation of the refresh instruction signal RREQ for performing a count operation to produce a refresh row address signal, a refresh address input buffer 21 for latching the refresh row address signal from the refresh address counter 20 according to a refresh address latch instruction signal RAL to produce an internal refresh row address signal, an X address input buffer 22 responsive to activation of the internal chip enable signal CE for taking in and latching an external X address signal XAD, a match detection circuit 23 for detecting match/mismatch between an internal X address from the X address input buffer 22 and a refresh address from the refresh address input buffer 21, a Y address input buffer 24 responsive to the internal chip enable signal CB for taking in an external Y address YAD to produce an internal Y address, a Y decoder 25 for decoding the internal Y address from the Y address input buffer 24 to produce a decode signal YF, a timing detection circuit 26 for detecting which of the internal chip enable signal CE and the refresh instruction signal RREQ is activated earlier, and a switching circuit 27 for transmitting the decode signal YF from the Y decoder 25 to a path of one of the column selection signal Y and the refresh column selection signal YR according to a match detection signal from the match detection circuit 23 and a timing detection signal from the timing detection circuit 26.

If the refresh operation and the data access are performed to the same row, this switching circuit 27 selects the column selection gate corresponding to the operation performed earlier, according to the decode signal YF. Thus, the data access can be performed at earlier tinning, eliminating the need to wait for the delay time At shown in FIG. 17. As a result, high-speed access can be realize.

Figure 20:
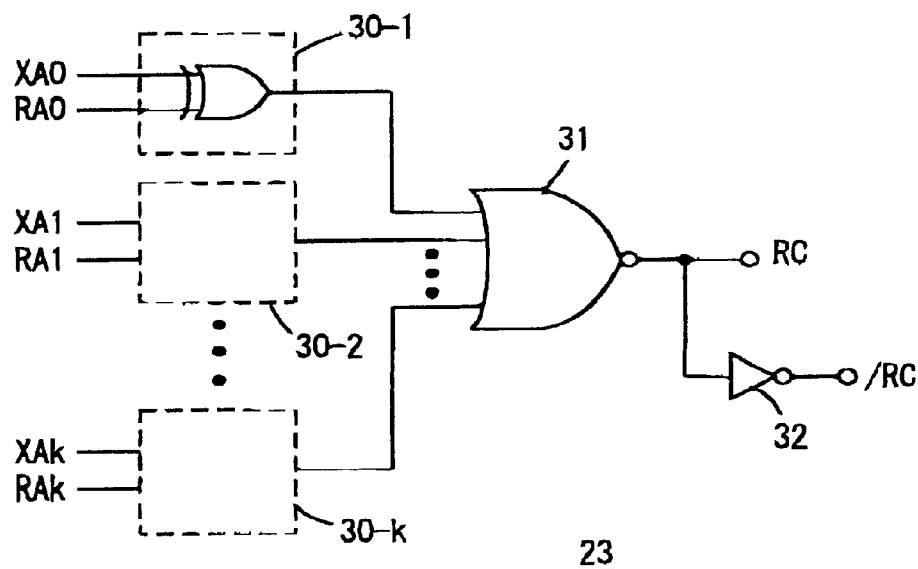
FIG. 20 is a diagram showing one example of the structure of a match detection circuit shown in FIG. 19.

FIG. 20 is a diagram showing one example of the structure of the match detection circuit 23 shown in FIG. 19. In FIG. 20, the match detection circuit 23 includes EXOR circuits 30-1 to 30-k receiving corresponding bit pairs XA0 to XAk and RA0 to RAk of the refresh address signal RA and internal X address signal XA, a NOR circuit 31 receiving output signals of the EXOR circuits 30-1 to 30-k, and an inverter circuit 32 receiving an output signal of the NOR circuit 31 The EXOR circuit 30-i receives address bits XAi and RAi. When the logical values of these bits match with each other, the EXOR circuit 30-i outputs an L-level signal. Accordingly, when the refresh address RA and X address XA match with each other, all the output signals of the EXOR circuits 30-1 to 30-k are at L level. The NOR circuit 31 outputs an H-level signal when all the input signals are at L level.

Accordingly, the H-level match detection signal RC from the NOR circuit 31 indicates that the refresh row is the same as the data access row. The inverter circuit 32 produces an inverted signal /RC of the match detection signal RC. Therefore, in the case where the refresh row is not the same as the access row, the mismatch detection signal /RC from the inverter circuit 32 is at H level.

The timing detection circuit 26 has the same structure as that of the arbitration circuit 12 shown in FIG. 15 The timing detection circuit 26 activates one of the normal row activation signal NOR and refresh activation signal REF according to the timing relation between the internal chip enable signal CE and refresh instruction signal RREQ.

Figure 21:
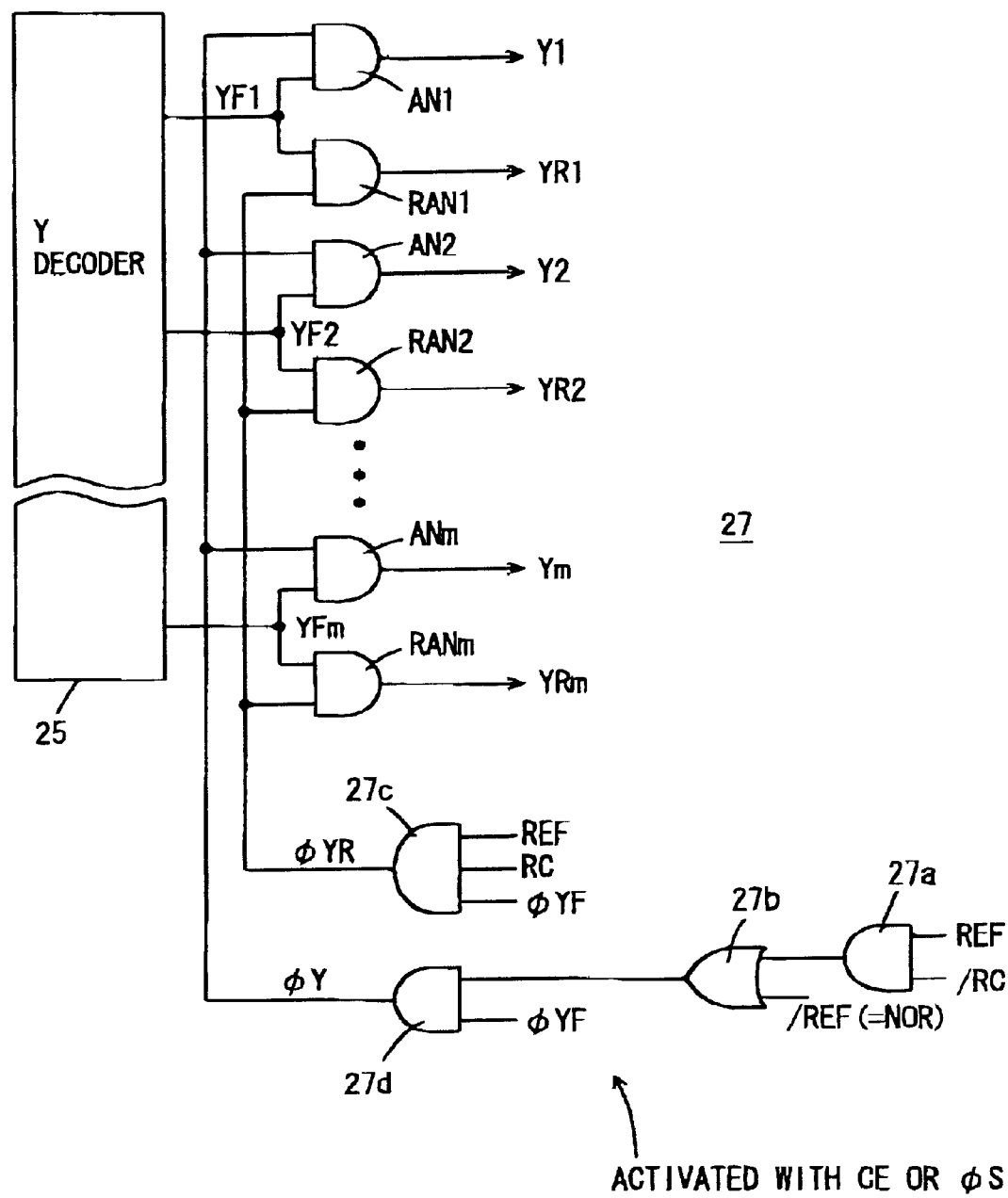
FIG. 21 is a diagram showing the structure of a switching circuit shown in FIG. 19.

FIG. 21 is a diagram showing one example of the structure of the switching circuit 27 shown in FIG. 19. In FIG. 21, the switching circuit 27 includes an AND circuit 27a receiving the refresh activation signal REF and mismatch detection signal /RC, an OR circuit 27b receiving an output signal of the AND circuit 27a and a complementary refresh activation signal /REF (i.e., normal row activation signal NOR), an AND circuit 27c receiving the refresh activation signal REF, match detection signal RC and column selection activation signal φYF, and an AND circuit 27d receiving an output signal of the OR circuit 27b and column selection activation signal φYF. A column selection operation is not performed in the refresh operation. Therefore, the column selection activation signal φYF that is activated in response to activation of the internal chip enable signal CE or to activation of the normal sense amplifier activation signal φS is utilized as a timing signal for the refresh column selection signal.

This switching circuit 27 further includes AND circuit pairs provided corresponding to respective decode signals YF1 to YFm output from the Y decoder 25. AND circuits AN1 and RAN1 are provided for the decode signal YF1, and AND circuits AN2 and RAN2 are provided for the decode signal YF2. AND circuits ANm and RANm are provided for the decode signal YFm. The AND circuits AN1 to ANm respectively produce column selection signals Y1 to Ym according to a corresponding decode signal in response to activation of a normal column selection activation signal φY from the AND circuit 27d. The AND circuits RAN1 to RANm are enabled according to a refresh column selection activation signal φYR output from the AND circuit 27c, and respectively produce refresh column selection signals YR1 to YRm according to the decode signals YF1 to YFm. The operation will now be described.

In the case where the refresh operation is earlier than the normal access operation, the refresh activation signal REF is activated, and the normal row activation signal NOR or signal /REF is deactivated When the normal access is instructed during activation of the refresh activation signal REF and the refresh row address RA matches the external access row address XA, the match detection signal RC goes to H level, and t he mismatch detection signal /RC goes to L level. Under such conditions, the output signal of the OR circuit 27b is at L level, and the output signal φY of the AND circuit 27d is kept at L level. When the column selection activation signal φYF rises to H level, the output signal φYR of the AND circuit 27c rises to H level, and one of the refresh column selection signals YR1 to YRm is set into the selected state at H level according to the decode signals YF1 to YFm. Thus, a refresh bit line pair is coupled to the internal data bus through the refresh column selection gate.

When the addresses do not match, the match detection signal RC is at L level and the mismatch detection signal /RC is at H level. Therefore, the output signal of the AND circuit 27c is kept at L level and the output signal of the AND circuit 27a goes to H level Responsively, the output signal of the OR circuit 27b goes to H level. Accordingly, when the column selection activation signal φYF is activated, the normal column selection activation signal φY from the AND circuit 27d is activated, and one of the normal column selection signals Y1 to Ym is driven to the selected state according to the decode signals YF1 to YFm.

In the case where the normal operation is instructed earlier than the refresh operation, the complementary refresh activation signal /REF (normal row activation signal NOR) goes to H level, and the output signal of the OR circuit 27b goes to H level. On the other hand, the refresh activation signal REF is at L level and thus the output signal φYR of the AND circuit 27c is at L level. Accordingly, in this case, the normal column selection activation signal φY is activated according to the column selection activation signal φYF, and the normal column selection signals Y1 to Ym are produced according the decode signals YF1 to YFm.

In the case where only the refresh operation is performed and the normal access is not performed, the column selection activation signal φYF is at L level, and thus the column selection activation signals φYR and φY are both at L level, whereby the column selection signals Y1 to Ym and YR1 to YRm are all kept at L level.

In the case where only the data access is performed, the output signal of the OR circuit 27b goes to H level. When the column selection activation signal φYF goes to H level, the normal column selection activation signal φY is activated, whereby one of the normal column selection signals Y1 to Ym is driven to the selected state.

In the foregoing description, one of the normal column selection signals Y1 to Ym or one of the refresh column selection signals YR1 to YRm is driven to the selected state. However, in the case where a plurality of internal data line pairs are provided, two or more of the decode signals YF1 to YFm are activated in parallel.

As has been described above, according to Embodiment 3 of the present invention, in the case where the refresh operation and the normal data access are performed and the refresh row address matches the external data access row address, the column selection gate corresponding to the operation mode activated at earlier timing is selected Thus, rapid access can be realized even when the refresh operation and the normal data access overlap each other.

Embodiment 4

Figure 22:
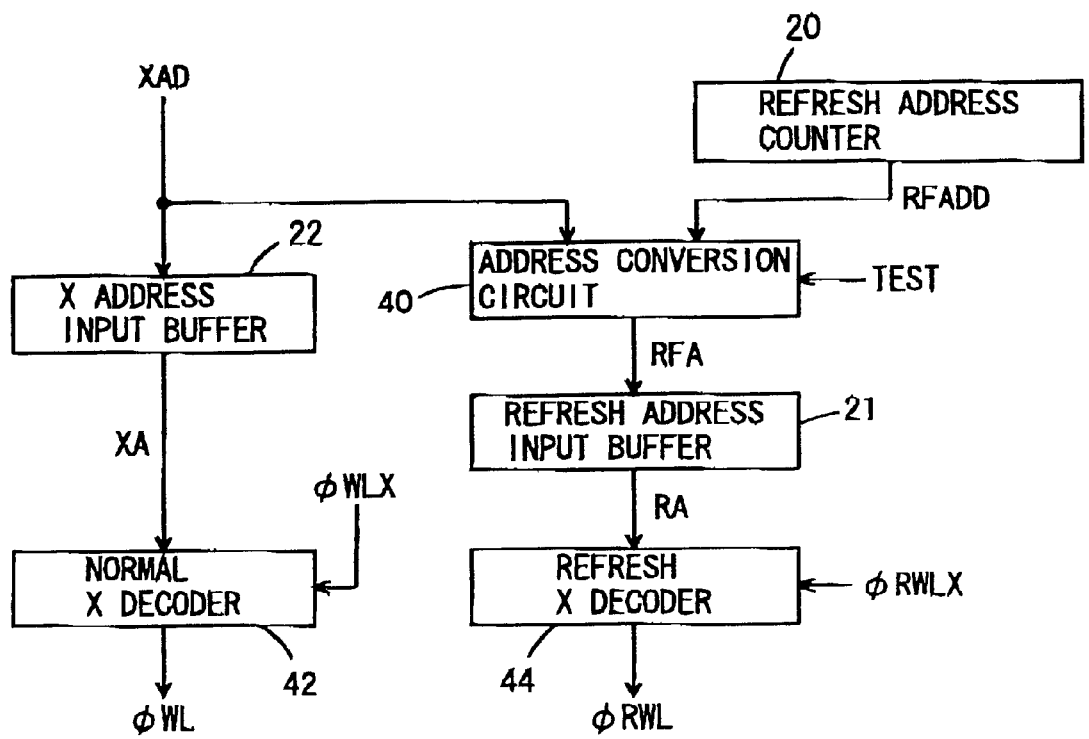
FIG. 22 is a diagram schematically showing the structure of a main portion of a semiconductor memory device according to Embodiment 4 of the present invention.

FIG. 22 is a diagram showing the structure of a man portion of a semiconductor memory device according to Embodiment 4 of the present invention. FIG. 22 shows the structure of a portion associated with a row address In FIG. 22, the semiconductor memory device includes an address conversion circuit 40 receiving an external X address signal XAD and a refresh address signal RFADD from a refresh address counter 20 and selecting one of the signals XAD and RFADD according to a test mode instruction signal TEST to produce a refresh address signal RFA, a refresh address input buffer 21 receiving the refresh address signal RFA from the address conversion circuit 40 to produce an internal refresh address RA, a normal X decoder 42 for decoding an internal row address XA from an X address input buffer 22 to produce a word line selection signal φWL according to a word line drive ting signal φWLX, and a refresh X decoder 44 for decoding the internal refresh address signal RA to produce a refresh word line selection signal φRWL according to a refresh word line drive timing signal φRWLX.

The normal X decoder 42 and refresh X decoder 44 each includes a word line driving circuit and drives, according to the decode result, a word line selection signal corresponding to the addressed row to the active state in response to the word line drive timing signal.

Figure 23:
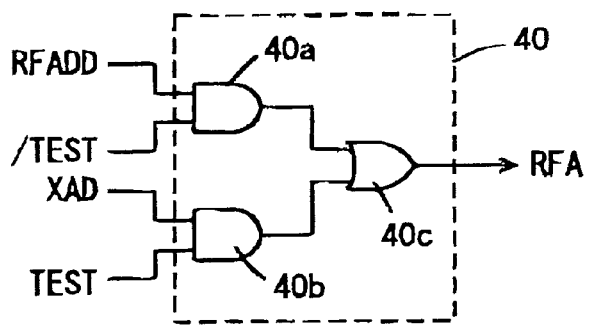
FIG. 23 is a diagram showing the structure of an address conversion circuit shown in FIG. 22.

FIG. 23 is a diagram showing one example of the structure of the address conversion circuit 40 shown in FIG. 22. In FIG. 23, the address conversion circuit 40 includes an AND circuit 40a receiving the refresh address signal RFADD from the refresh address counter 20 and a complementary test mode instruction signal /TEST, an AND circuit 40b receiving the external X address signal XAD and test mode instruction signal TEST, and an OR circuit 40c receiving output signals of the AND circuits 40a and 40b to produce a refresh address signal RFA. The test mode instruction signals TEST and /TEST are complementary to each other, and the test mode instruction signal TEST is at H level in the test mode.

When the test mode instruction signal TEST is at H level, the complementary test mode instruction signal TEST is at L level, and the AND circuit 40a inhibits transmission of the refresh address signal RFADD from the refresh address counter 20. Accordingly, in the test mode, the refresh address signal RFA is produced according to the external X address signal XAD.

When the test mode instruction signal TEST is at L level, the complementary test mode instruction signal /TEST is at H level. Accordingly in an operation mode other than the test mode (hereinafter, referred to as normal operation mode), the refresh address signal RFA is produced according to the refresh address signal RFADD from the refresh address counter 20.

The address conversion circuit 40 shown in FIG. 23 is essentially a multiplexer circuit, and AND gates are provided corresponding to respective bits of the refresh address signal RFADD and X address signal XAD.

In the test mode, the refresh address and the normal access row address are matched with each other Since the refresh address is not used in the test mode, the operation of a refresh timer may be inhibited in the test mode (the operation of a ring oscillator within the refresh timer is stopped by the test mode instruction signal TEST).

Figure 24:
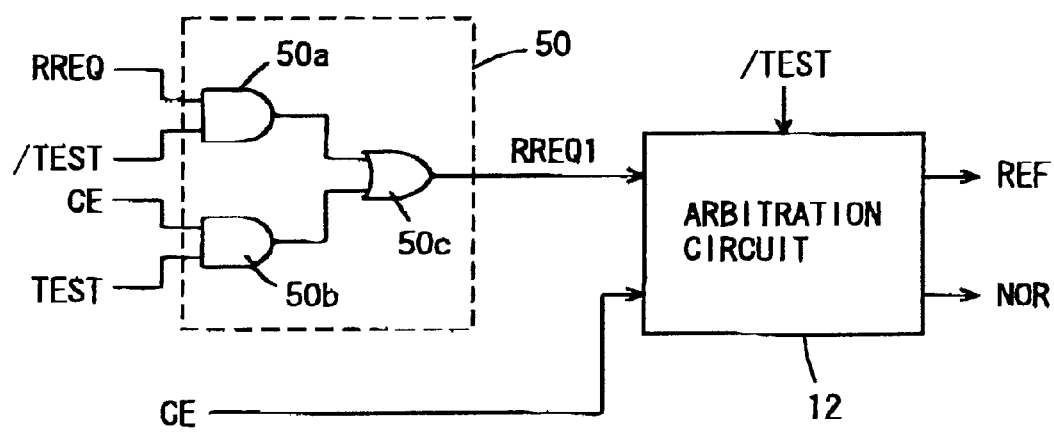
FIG. 24 is a diagram schematically showing the structure of an internal refresh instruction signal generation potion in Embodiment 4 of the present invention.

FIG. 24 is a diagram schematically showing the structure of a portion for generating a row-related activation signal in Embodiment 4 of the present invention In FIG. 24, the row-related activation signal generating portion includes a control conversion circuit 50 for selecting one of the refresh instruction signal RREQ and internal chip enable signal CE according to the test mode instruction signals TEST and /TEST to produce an internal refresh instruction signal RREQ1, and an arbitration circuit 12 receiving the internal refresh instruction signal RREQ1 from the control conversion circuit 50 and the internal chip enable signal CE to activate the refresh activation signal REF and normal row activation signal NOR according to the complementary test mode instruction signal /TEST.

The refresh instruction signal RREQ and internal chip enable signal CE are applied respectively from the refresh instruction signal generation circuit 11 and input buffer circuit 10 shown in FIG. 7. The control conversion circuit 50 includes an AND circuit 50a receiving the refresh instruction signal RREQ and complementary test mode instruction signal /TEST, an AND circuit 50b receiving the internal chip enable signal CE and test mode instruction signal TEST, and an OR circuit 50c receiving output signals of the AND circuits 50a and 50b. The internal refresh instruction signal RREQ1 is produced from the OR circuit 50c.

In this structure of the control conversion circuit 50, the internal refresh instruction signal RREQ1 is produced according to the internal chip enable signal CE when the test mode instruction signal TEST is at H level. On the other hand, in the normal operation mode in which the complementary test mode instruction signal /TEST is at H level, the internal refresh instruction signal RREQ1 is produced according to the refresh instruction signal RREQ from the refresh instruction signal generation circuit 11 through the AND circuit 50a and OR circuit 50c.

In other words, in the test mode, the refresh operation is performed under the external control Unlike the structure shown in FIG. 15, this arbitration circuit 12 does not perform an arbitration operation when the test mode instruction signal TEST is at H level, but produces the refresh activation signal REF and normal row activation signal NOR according to the internal refresh instruction signal RREQ1 and internal chip enable signal CE. Accordingly, in the test mode, the refresh instruction signal RREQ1 is produced according to the internal chip enable signal CE, and therefore the refresh operation and the normal row selection operation are simultaneously performed according to the internal chip enable signal CE.

Figure 25:
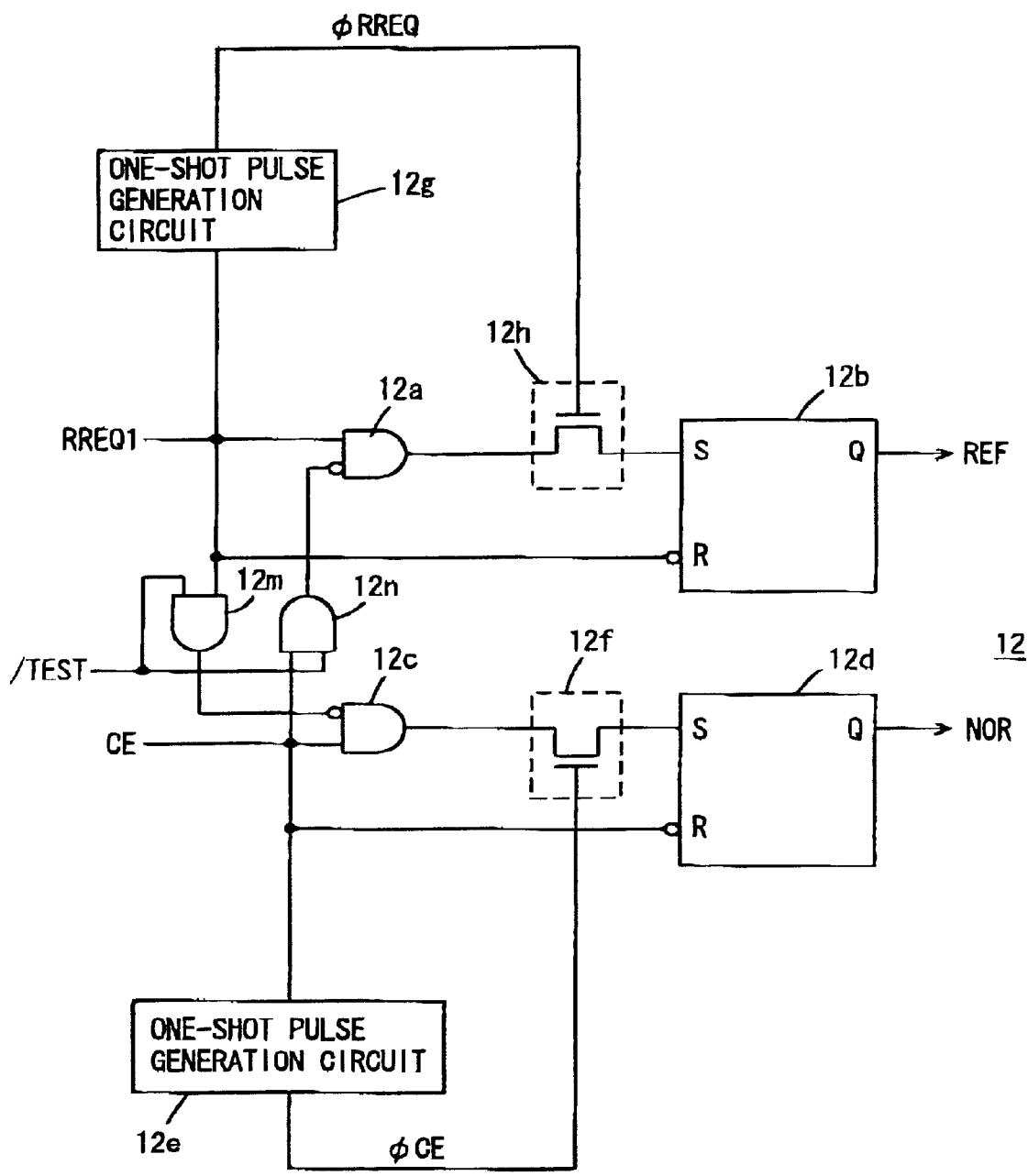
FIG. 25 is a diagram showing the structure of an arbitration circuit shown in FIG. 24.

FIG. 25 is a diagram showing one example of the structure of the arbitration circuit shown in FIG. 24 The arbitration circuit 12 of FIG. 25 is different in structure from that shown in FIG. 15 in the following points; this arbitration circuit 12 includes an AND circuit 12m receiving the complementary test mode instruction signal /TEST and internal refresh instruction signal RREQ1, and an AND circuit 12n receiving the complementary test mode instruction signal /TEST and internal chip enable signal CE. An output signal of the AND circuit 12m is applied to the complementary input of the gate circuit 12c, and an output signal of the AND circuit 12n is applied to the complementary input of the gate circuit 12a.

In the structure shown in FIG. 25, the output signals of the AND circuits 12n and 12m are at L level when the complementary test mode instruction signal /TEST is at L level.

Accordingly, the gate circuits 12a and 12c are enabled, and the set/reset flip flops 12b and 12d are set respectively according to the internal refresh instruction signal RREQ1 and internal chip enable signal CE through the transfer gates 12h and 12f. Therefore, when the internal refresh instruction signal RREQ 1 rises to H level, the refresh activation signal REF is also activated When the internal chip enable signal CE is activated, the normal row activation signal NOR is also activated.

In the normal operation mode, the complementary test mode instruction signal /TEST is at H level, and the AND circuits 12m and 12n operate as buffers so as to pass the internal refresh instruction signal RREQ1 and internal chip enable signal CE therethrough, respectively. Accordingly, in this state, the gate circuits 12a and 12c as well as the transfer gates 12h and 12f determine the timing relation between a refresh request and normal access Then, one of the refresh activation signal REF and normal row activation signal NOR is activated according to the determination result.

Figure 26:
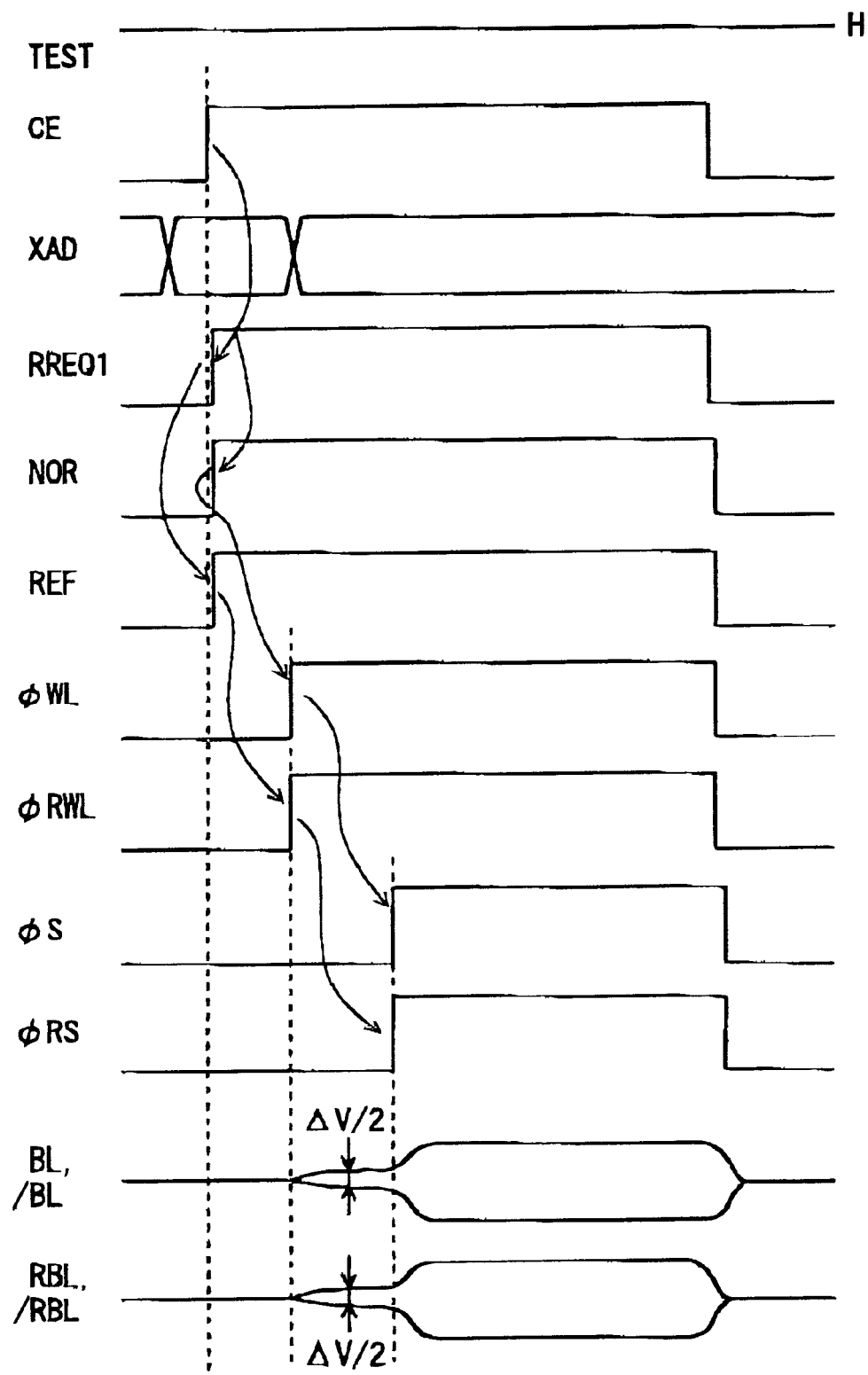
FIG. 26 is a signal waveform diagram representing the operation of the semiconductor memory device according to Embodiment 4 of the present invention.

In Embodiment 4, the normal row-related control circuit and refresh row-related control circuit each has the same structure as that shown in FIG. 16. Now, operation of the structure shown in FIGS. 22 to 25 will be described with reference to the signal waveform diagram shown in FIG. 26.

In the test mode, the test mode instruction signals TEST and /TEST are set to H level and L level respectively. In this state, if the internal chip enable signal CE is activated to H level according to the external chip enable signal, the simultaneously applied X address signal XAD is latched into the X address input buffer 22 shown in FIG. 22. The address conversion circuit 40 shown in FIG. 22 produces a refresh address signal RFA according to the X address signal XAD. When the internal chip enable signal CE rises to H level, the internal refresh instruction signal RREQ1 rises to H level through the control conversion circuit 50.

Since the complementary test mode instruction signal /TEST is at L level, the arbitration circuit 12 shown in FIGS. 24 and 25 drives the refresh activation signal REF and normal row activation signal NOR to the active state at H level according to the internal refresh instruction signal RREQ1 and internal chip enable signal CE The row-related control circuits have the same structure as that shown in FIG. 16. When the internal chip enable signal CE and internal refresh instruction signal RREQ1 rise to H level, word line drive timing signal φWLX and φRWLX rise after a predetermined time, and a normal word line selection signal φWL and refresh word line selection signal φRWL rise to H level through the normal X decoder 42 and refresh X decoder 44 shown in FIG. 22, respectively. Accordingly, the data in the selected memory cells are read onto the bit lines BL, /BL and RBL, /RBL. In this case, two bit lines, i.e., normal and refresh bit lines, are connected to a single capacitor, the read voltage on each bit line is substantially halved. After a predetermined time, sense amplifier activation signals φS and φRS are activated, and the voltages on the bit lines BL, /BL and RBL, /RBL are differentially amplified and latched.

When a single operation cycle is completed, the internal chip enable signal CE falls from H level to L level, and each control signal is rendered inactive at L level. As a result, the bit lines BL, /BL and RBL, /RBL are also returned to the precharge state.

In this test mode, the read voltage of the data read from the memory cells is substantially $\Delta V/2$. Accordingly, the read voltage is reduced as compared to that in the normal operation. The sense margin is detected by detecting whether the sensing operation is accurately performed or not in this state. The data of "1" and "0" is written to the memory cells, and then the write data is read. Whether the sensing operation is accurately performed or not is determined by identifying match/mismatch in logic between the read data and write data. Thus, the sense margin is checked.

Figure 27:
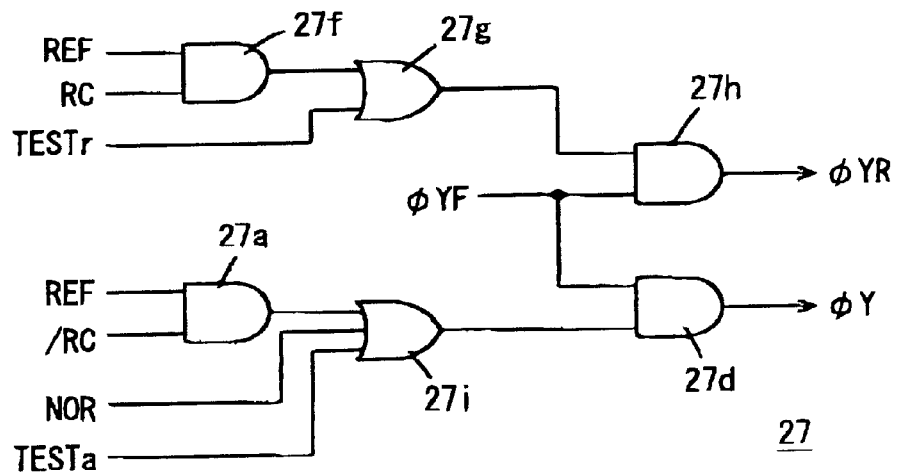
FIG. 27 is a diagram showing the structure of a column selection switching portion in Embodiment 4 of the present invention

FIG. 27 is a diagram schematically showing the structure of a column selection switching circuit portion of Embodiment 4. The structure of the column selection switching portion shown in FIG. 27 corresponds to the structure of the switching circuit 27 shown in FIG. 19. In FIG. 27, the switching circuit 27 includes an AND circuit 27f receiving the refresh activation signal REF and match detection signal RC, an OR circuit 27g receiving a test mode instruction signal TESTr and an output signal of the AND circuit 27f, and an AND circuit 27h receiving an output signal of the OR circuit 27g and column selection activation signal φYF to produce a refresh column selection signal φYR. The test mode instruction signal TESTr is activated when the test data is read/written through a refresh column.

This switching circuit 27 further includes an AND circuit 27a receiving the refresh activation signal REF and mismatch detection signal /RC, an OR circuit 27i receiving the normal row activation signal NOR, a test mode instruction signal TESTa and an output signal of the AND circuit 27a, and an AND circuit 27d receiving the column selection activation signal φYF and an output signal of the OR circuit 27i to produce a normal column selection signal φY. The test mode instruction signal TESTa is activated when the test data is read/written through normal bit lines.

In the case where the sensing operation of the same memory cell data is performed with a normal sense amplifier and refresh sense amplifier, the normal sense amplifier and refresh sense amplifier can be tested individually. In the test mode in which the refresh word line and normal word line are simultaneously selected, the normal sense amplifier and refresh sense amplifier are simultaneously activated with the normal and refresh bit lines coupled to each other through the memory cell. Accordingly, if the normal sense amplifier and refresh sense amplifier have different characteristics, the normal sense amplifier and refresh sense amplifier may drive the bit lines in the opposite direction in the sensing operation. In this case, the data is in the indefinite state. Thus, erroneous data is read, whereby it is determined that the sense margin is small.

On the other hand, if one of the sense amplifier circuits has larger driving capability than the other sense amplifier circuit, both sense amplifier circuits may read erroneous data or may be set to the correct state. In this case, the respective sense margin of the normal sense amplifier and refresh sense amplifier can be checked by individually reading the respective latch data in the normal sense amplifier and refresh sense amplifier.

As has been described above, according to Embodiment 4 of the present invention, the normal and refresh word lines are simultaneously driven to the selected state in the test mode. Therefore, the read voltage on the bit lines can be reduced, and the read margin can easily be checked. Note that the test mode instruction signals TEST, TESTr and TESTa may be applied directly from the outside, may be set according to the signal timing relation, or may be set to a register circuit according to a command, Embodiment 5

Figure 28:
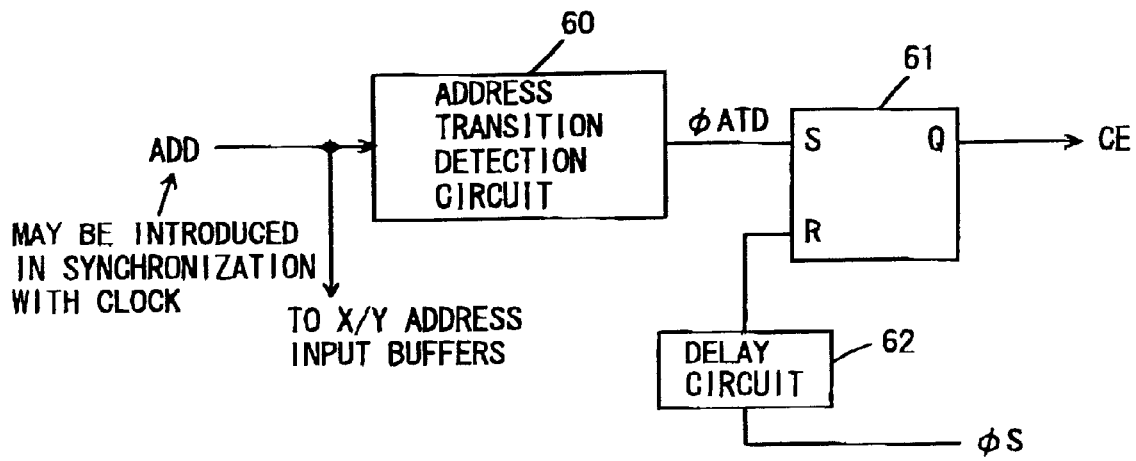
FIG. 28 is a diagram schematically showing the structure of a man part of a semiconductor memory device according to Embodiment 5 of the present invention.
Figure 29:
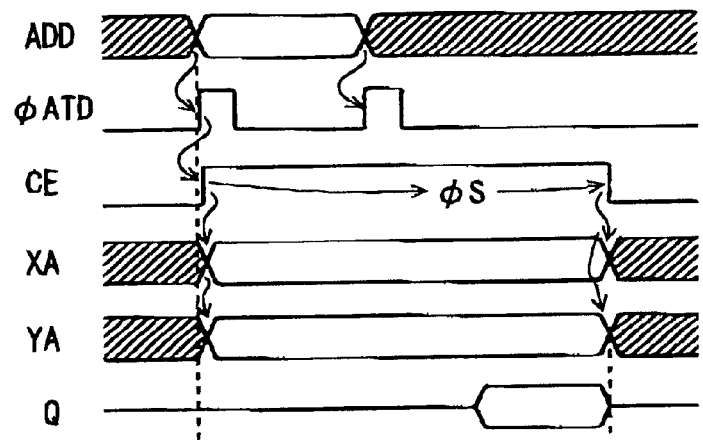
FIG. 29 is a signal waveform diagram representing the operation of the circuitry shown in FIG. 28.

FIG. 28 is a diagram showing the structure of a main part of a semiconductor memory device according to Embodiment 5 of the present invention. In FIG. 28, an address transition detection circuit 60 for detecting a transition in an external address signal ADD, a set/reset flip flop 61 being set in response to activation of an address transition detection signal φATD from the address transition detection circuit 60, and a delay circuit 62 for delaying a sense amplifier activation signal φS by a predetermined time to reset the set/reset flip flop 61 are provided in order to generate an internal chip enable signal CE. The internal chip enable signal CE is produced at an output Q of the set/reset flip flop 61. Now, the operation of the internal chip enable signal generation circuitry shown in FIG. 28 will be described with reference to the signal waveform diagram of FIG. 29.

The external address signal ADD includes both X and Y addresses. When the address signal ADD is changed, the address transition detection circuit 60 activates the address transition detection signal φATD. Accordingly, the set/reset flip flop 61 is set and the internal chip enable signal CE is activated. In response to activation of the internal chip enable signal CE, address input buffers are brought into the latch state, and produce an internal X address signal XA and internal Y address signal YA according to the external address signal ADD.

Selection of a normal word line and activation of a normal sense amplifier are sequentially performed according to activation of the internal chip enable signal CE. When the normal sense amplifier activation signal φS is activated and the memory cell data is transmitted onto a normal bit line pair, column selection is then performed according to the Y address signal YA. In the data read mode, memory cell data in the selected row is read. The delay time of the delay circuit 62 is determined in view of the time required for the data read operation. After the time required for the data read operation has passed from activation of the sense amplifier activation signal φS, an output signal of the delay circuit 62 is activated, whereby the set/reset flip flop 61 is reset and the internal chip enable signal CE is deactivated. Thus, an access cycle is completed.

If the external address signal ADD changes after the holding time during this access cycle period, the address transition detection signal φATD is generated. However, since the set/reset flip flop 61 is in the set state, this activation of the address transition detection signal φATD does not affect the internal chip enable signal CE.

Accordingly, the cycle time of the semiconductor memory device can be deterred by the delay time of the delay circuit 62, and also, an external chip enable signal need not be applied As a result, the number of pin terminals can be reduced.

Modification 1

Figure 30:
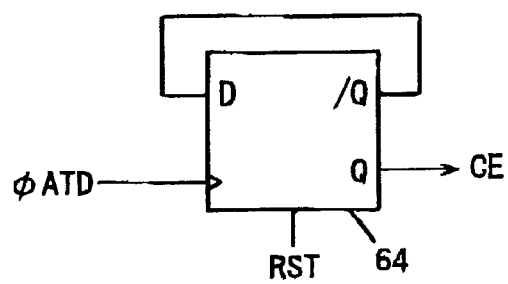
FIG. 30 is a diagram schematically showing the structure of Modification 1 of Embodiment 5 of the present invention.
Figure 31:
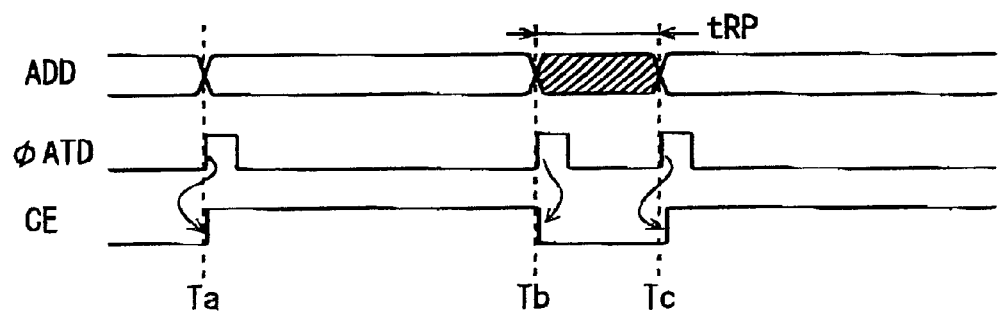
FIG. 31 is a signal waveform diagram representing the operation of the structure shown in FIG. 30.

FIG. 30 is a diagram showing the structure of a modification of Embodiment 5 of the present invention. In the structure shown in FIG. 30, a D-type flip flop 64 is provided which, in response to activation of the address transition detection signal φATD, takes in a signal of the output /Q so as to output it from the output Q The internal chip enable signal CE is produced at the output Q of the D-type flip flop 64 The address transition detection signal φATD is applied from the address transition detection circuit 60 shown in FIG. 28. With a reset signal RST, the D-type flip flop 64 resets the internal chip enable signal CE to the inactive state at L level in the initial state. Now, the operation of the D-type flip flop 64 shown in FIG. 30 will be described with reference to the signal waveform diagram shown in FIG. 31.

If the address signal ADD changes and the address transition detection signal φATD is activated at time Ta, the D-type flip flop 64 takes in an H level signal from the output /Q for output. Accordingly, the internal chip enable signal CE is activated in response to activation of the address transition detection signal φATD. An internal row selection operation is conducted according to activation of the internal chip enable signal CE. During the access cycle period, the address signal ADD is kept in a fixed state.

If the address signal ADD changes to the invalid state at time Tb, the address transition detection signal φATD is similarly activated. Accordingly, the internal chip enable signal CE is deactivated since the output /Q of the D-type flip flop 64 is at L level.

If the address signal ADD changes at time Tc, the address transition detection signal φATD is activated and the internal chip enable signal CE is activated again. The access cycle is determined by this address signal ADD. In this case as well, an external chip enable signal need not be applied, whereby the number of pin terminals can be reduced.

Note that the time period between time Tb and time Tc is desirably set to a so-called RAS precharge time tRP during which the semiconductor memory device is internally returned to the precharge state. Thus, the subsequent access can be performed after the entire semiconductor memory device is internally returned to the precharge state.

Modification 2

Figure 32A:
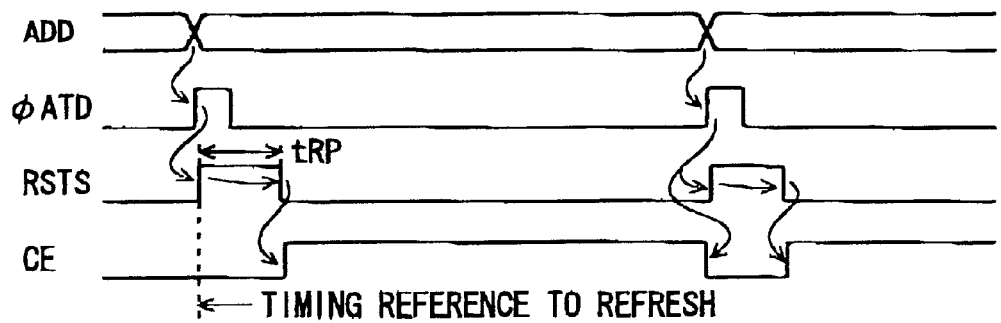
FIG. 32A is a signal waveform diagram representing the operation of Modification 2 of Embodiment 5 of the present invention.

FIG. 32A is a signal waveform diagram representing the operation of Modification 2 of Embodiment 5 of the present invention. In FIG. 32A, the address transition detection signal φATD is produced according to a change in the external address signal ADD. A reset signal RSTS having predetermined time duration is produced according to the address transition detection signal φATD. The internal chip enable signal CE is activated in response to deactivation of the reset signal RSTS. The internal chip enable signal CE is normally reset with the address transition detection signal φATD. The reset signal RSTS is applied to the normal row-related circuit, and has a time duration corresponding to the RAS precharge time tRP. Accordingly, when a memory cycle is started with application of the address transition detection signal φATD, the normal row-related circuit is first reset internally, and then a row selection operation is started.

Figure 32B:
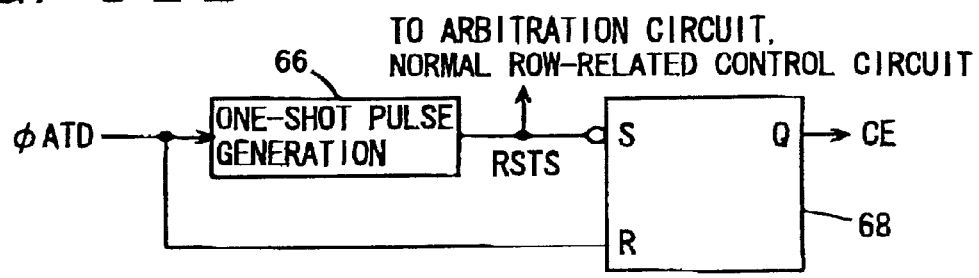
FIG. 32B is a diagram showing the structure of circuitry according to Modification 2 of Embodiment 5 of the present invention.

FIG. 32B is a diagram showing one example of circuitry for realizing the operation sequence shown in FIG. 32A In FIG. 32B, the internal chip enable signal generation circuitry includes a one-shot pulse generation circuit 66 for generating a one-shot pulse signal having a predetermined time duration in response to activation of the address transition detection signal φATD, and a set/reset flip flop 68 being set in response to the fall of the signal RSTS from the one-shot pulse generation circuit 66 and reset in response to activation of the address transition detection signal φATD. The reset signal RSTS is output from the one-shot pulse generation circuit 66, and applied to the normal row-related control circuit and the arbitration circuit. In the structure shown in FIG. 16, an OR operation of the reset signal RSTS and the reset signal RST from the NOR circuit 12j is performed, and the operation result is applied to the set/reset flip flops 13e and 13g. The internal chip enable signal CE is produced from the set/reset flip flop 68.

There is a case where the refresh operation and row access are being performed internally when the normal row-related circuit is reset with the reset signal RSTS. In the case where the normal external access is being performed first, the normal row-related circuit is first operated according to the internal chip enable signal CE, and then the refresh row-related circuit is operated in response to activation of the normal sense amplifier activation signal. Even if the reset signal RSTS is activated before activation of the refresh sense amplifier activation signal from the refresh row-related control circuit, only the normal sense amplifier of the normal row-related circuit is reset, and the refresh sense amplifier circuit performs a sensing operation to refresh the memory cell data. Therefore, it is not problematic to precharge the normal row-related circuit at this timing. If the internal chip enable signal CE then rises again in the refresh operation, the refresh sense amplifier activation signal is in the active state at this time, and therefore a normal word line is driven to the selected state after the delay time of the delay circuit 13a shown in FIG. 16.

In the case where the refresh operation is performed first, the refresh row-related circuit and normal row-related circuit are operated according to the refresh instruction signal RREQ Accordingly, it does not adversely affect the refresh operation to set the normal row-related circuit to the precharge state according to the address transition detection signal φATD. The internal chip enable signal CE is not activated until this precharge operation is completed. Therefore, the normal word line selection is not performed, causing no adverse effect.

Note that in arbitrating conflict between the refresh operation and normal access, the reset signal RSTS is used as a timing reference to the refresh instruction. In other words, as shown in FIG. 32B, the reset signal RSTS is applied to the normal row-related control circuit and arbitration circuit. The arbitration circuit arbitrates between the refresh operation and normal access operation with the reset signal RSTS used as a memory cell selection cycle start instruction signal. In the structure of the arbitration circuit 12 shown in FIG. 15, the reset signal RSTS is applied instead of the internal chip enable signal CE. However, the reset signal RSTS is a one-shot pulse signal. Therefore, in the case where the refresh instruction signal RREQ is activated after the fall of the reset signal RSTS to L level, the refresh activation signal REF may not be activated In this case, a signal resulting from the AND operation of a signal from the output Q of the set/reset flip flop 12b and an inverted signal of the normal row activation signal NOR is used as refresh activation signal REF. Thus, an accurate arbitration operation can be performed even if such a one-shot pulse reset signal RSTS is used.

The internal chip enable signal CE is applied to the normal row-related control circuit In response to activation of the internal chip enable signal CE, the delayed activation signal CED from the delay circuit shown in FIG. 16 is activated. Then, according to the arbitration result, the normal row selection is performed according to the normal row activation signal NOR or refresh sense amplifier activation signal φRS.

Accordingly, in the structure shown in FIG. 32B, the instruction to start a memory cell selection cycle is supplied by the reset signal RSTS, and the instruction to end the memory cell selection cycle is supplied by the address transition detection signal φATD. The memory cell selection cycle is started with the internal reset operation, and internal memory cell selection is performed after the reset operation is completed.

As has been described above, according to Embodiment 5 of the present invention, the internal chip enable signal is produced according to detection of an address transition. Thus, the number of signal input terminals, and thus the chip area can be reduced.

Embodiment 6

Figure 33:
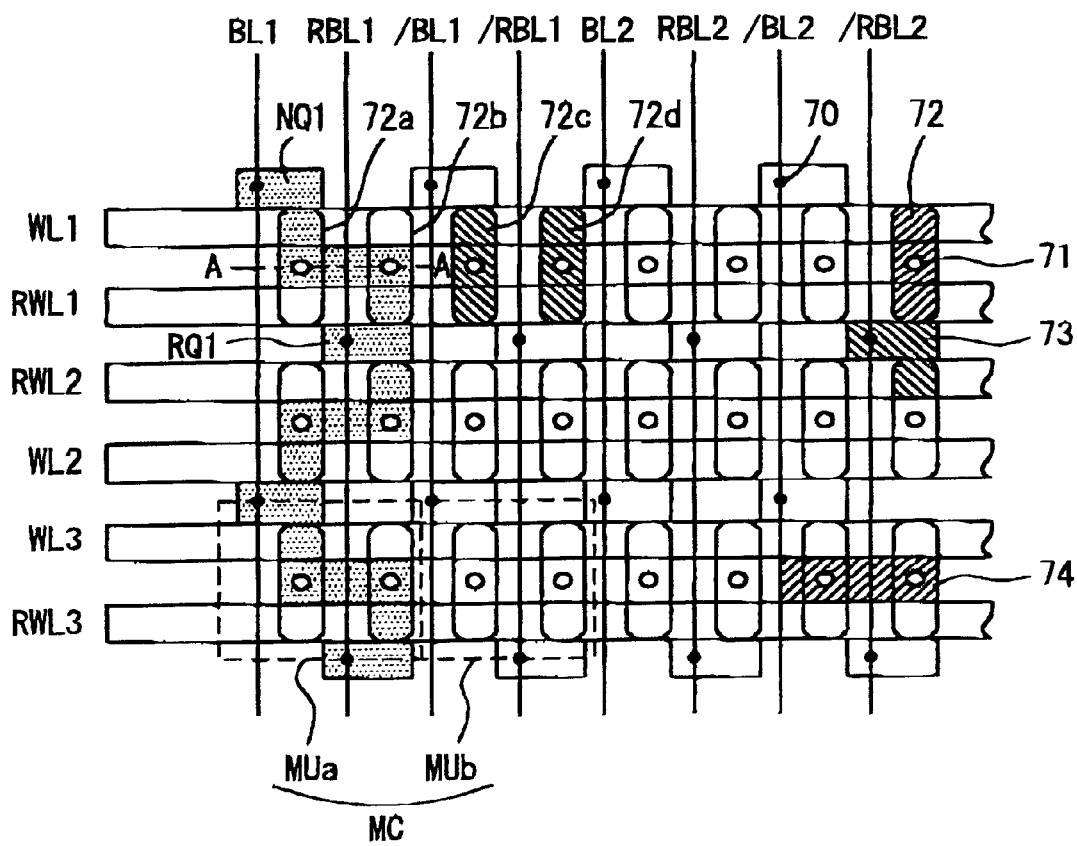
FIG. 33 is a diagram schematically showing the layout of a memory array portion of a semiconductor memory device according to Embodiment 6 of the present invention.

FIG. 33 is a diagram schematically showing the layout of a memory array according to Embodiment 6 of the present invention. FIG. 33 schematically shows the layout of memory cells MC arranged in three rows and two columns. In FIG. 33, two refresh word lines RWL1, RWL2 and two normal word lines WL2, WL3 are provided in pairs so as to be adjacent to each other. A normal word line WL1 is provided adjacent to the refresh word line RWL1, and a refresh word line RWL3 is provided adjacent to the normal word line WL3. In this word line arrangement, sets of two refresh word lines RWL are located alternately with sets of two normal word lines WL.

Capacitor contacts 71 are provided between the refresh word line RWL and normal word line WL in alignment in the row direction. The capacitor contact 71 is a contact for electrically connecting a memory transistor to a capacitor.

Normal bit lines BL1, BL2, /BL1 and /BL2 as well as refresh bit lines RBL1, /RBL1, RBL2 and /RBL2 extend in the Column direction. In this bit line arrangement, the normal bit lines BL (or /BL) are located alternately with the refresh bit lines RBL (or /RBL). Memory cell transistors NQ are provided corresponding to the respective intersections of the normal word lines WL and normal bit lines BL (/BL). Refresh transistors RQ are provided corresponding to the respective intersections of the refresh bit lines RBL (or /RBL) and refresh word lines RWL. FIG. 33 exemplarily shows a memory access transistor NQ1 provided corresponding to the intersection of the normal word line WL1 and normal bit line BL1, and a refresh transistor RQ1 provided corresponding to the intersection of the refresh word line RWL1 and refresh bit line RBL1.

Capacitive elements 72 forming capacitors are provided at a pitch of the pair of normal and refresh word lines WL and RWL. The capacitive element 72 has its storage electrode node coupled to an impurity region of a corresponding memory access transistor through the corresponding capacitor contact 71.

A single transistor NQ and a single transistor RQ form a single memory unit MU. FIG. 33 shows two memory units MUa and MUb. These two memory units MUa and MUb form the memory cell MC. In the memory unit, the capacitor contacts 71 of the two transistors NQ and RQ are coupled to each other through an impurity region 74.

In the layout shown in FIG. 33, lateral-T-shaped memory transistor pairs are provided with two word line spacing laid between adjacent memory transistor pairs in the column direction, and the pair of transistors in each memory unit share the impurity region at their one conductive nodes. Thus, four-transistor/two-capacitor memory cells can be arranged with the one-transistor/one-capacitor memory cell layout.

The capacitive elements 72a and 72b are coupled to the impunity region 74 through the respective capacitor contacts 71, but their storage nodes are isolated from each other. The capacitive elements 72a and 72b form a single capacitance C1, and the capacitive elements 72c and 72d form a single capacitance C2.

Figure 34:
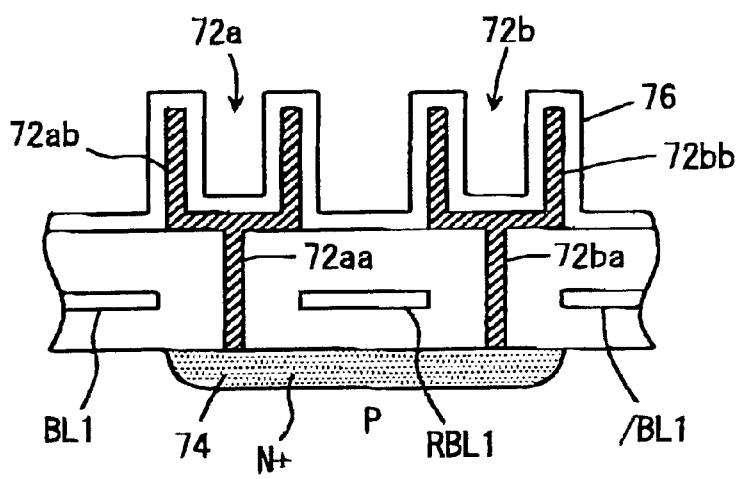
FIG. 34 is a diagram schematically showing the cross-sectional structure taken along the line A—A of FIG. 33.

FIG. 34 is a diagram schematically showing the cross sectional structure taken along the one-dotted chain line A—A of FIG. 33. In FIG. 34, the capacitive element 72a includes a leg region 72aa formed in the region between the bit lines BL and RBL1 and extending in a capacitor contact, and a storage node 72ab having a U shape in cross section and electrically connected to the leg region 72aa The leg region 72aa is formed in a capacitor contact (not shown) region and coupled to the impurity region 74. This impurity region 74 is an N-type impurity region.

The capacitive element 72b is formed in a region spaced from the capacitive element 72a, and includes a leg region 72ba formed between the bit lines RBL1 and /BL1 and extending through a capacitor contact (not shown), and a storage node 72bb formed on the leg region 72ba so as to be a U shape in cross section. A cell plate electrode layer 76 is formed facing the storage nodes 72ab and 72bb of the capacitive elements 72a and 72b with a not-shown capacitor insulating Mm laid therebetween. The portion where the storage nodes 72ab and 72bb having a U shape in cross section face the cell plate electrode layer 76 forms a capacitance. The cell plate electrode layer 76 is formed from a high melting point metal such as a refractory metal and polysilicon. The storage nodes 72ab and 72bb are also formed from a refractory metal such as polysilicon For example, in order to increase the capacitance value as much as possible, a high permittivity, two-layered insulating film formed from silicon nitride and silicon oxide films may be used as capacitor insulating film.

In the structure shown in FIG. 34, the capacitive elements 72a and 72b are electrically coupled to each other through the impurity region 74. Accordingly, the memory cell capacitance C1 is applied from a parallel connection body of the capacitive elements 72a and 72b.

By using a cylindrical stacked capacitor as memory capacitor shown in FIG. 33, the surface area of the storage nodes 72ab and 72bb having a U shape in cross section can be increased, and therefore the capacitance value of the capacitance per unit area can be increased.

In one-transistor/one-capacitor memory cells of the normal DRAM, the capacitor contacts 71 are not electrically connected to each other through the impurity region 74, but are isolated from each other. These capacitor contacts are used as capacitors of individual memory cells. Accordingly, four-transistor/two-capacitor memory cells can be realized by merely arranging the memory cells according to the same layout as that of the conventional memory cell layout to electrically connect both capacitor contacts (within a single memory unit) to each other through the impurity region 74. In other words, the memory cells of the present invention can be easily formed by merely changing a mask for forming the impurity region in the conventional memory cell manufacturing process.

Note that the hollow, cylindrical stacked capacitor having a U shape in cross section is herein exemplarily shown as memory cell capacitor However, a memory cell capacitor having another structure may alternatively be used.

The bit lines BL, RBL, /BL and /RBL are formed in the same interconnection layer under the storage nodes, and are alternately located outside an element active region.

As has been described above, according to Embodiment 6 of the present invention, the impurity region of the memory transistors is extended to connect two capacitor contacts to each other. Therefore, four-transistor/two-capacitor memory cells can be easily realized with the same manufacturing process as the conventional process.

Embodiment 7

Figure 35:
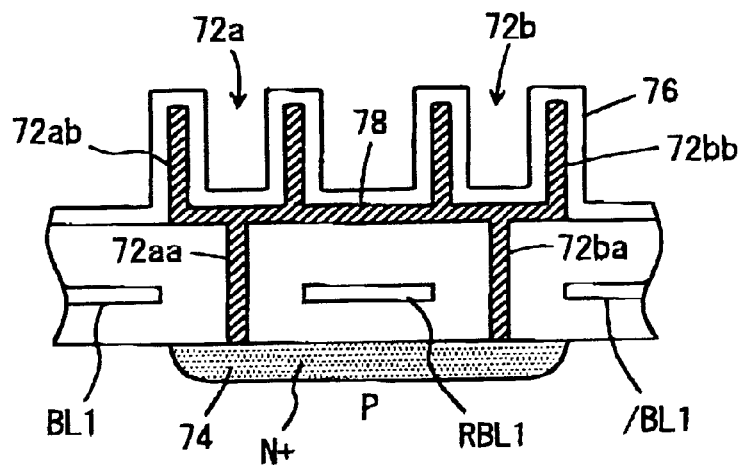
FIG. 35 is a diagram schematically showing the cross-sectional structure of a memory cell capacitor according to Embodiment 7 of the present invention.

FIG. 35 is a diagram schematically showing the structure of a memory cell capacitor according to Embodiment 7 of the present invention. In FIG. 35, in addition to the structure shown in FIG. 34, the storage nodes 72ab and 72bb are connected to each other through a conductive layer 78. Thus, the storage nodes 72*ab* and 72*bb* are electrically connected to each other. Accordingly, the conductive layer 78 forms an additional capacitance with the cell plate electrode layer 76, whereby the capacitance value can be increased. Like the storage nodes 72*ab* and 72*bb*, the conductive layer 78 is formed of a high melting point metal such as a refractory metal and polysilicon. A capacitor insulating film is formed between the conductive layer 78 and cell plate electrode layer 76.

The other structure of the memory cell capacitor shown in FIG. 35 is the same as that of FIG. 34. The storage node 72*ab* and 72*bb* formed spaced from each other are connected to each other through the conductive layer 78, whereby the conductive layer can be used as an additional capacitance. As a result, a memory cell capacitor occupying a small area as well as having a large capacitance value can be realized.

Embodiment 8

Figure 36A:
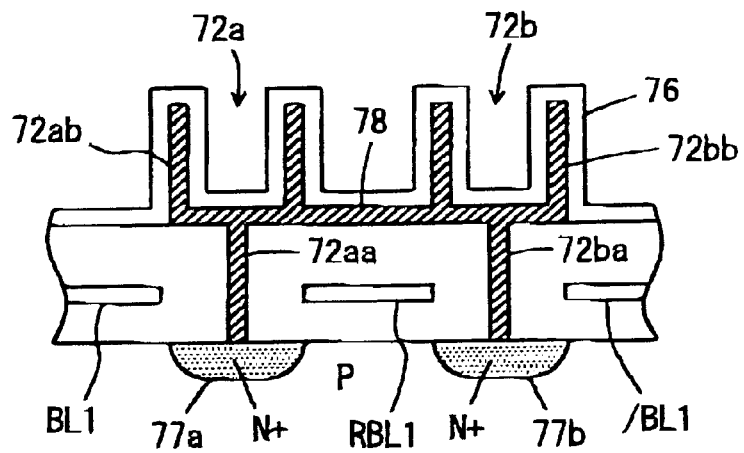
FIG. 36A is a diagram showing the cross-sectional structure of a memory cell capacitor according to Embodiment 8 of the present invention.

FIG. 36A is a diagram schematically showing the structure of a memory cell capacitor according to Embodiment 8 of the present invention. In FIG. 36A, the impurity region of the transistors is divided into impurity regions 77*a* and 77*b*. Storage nodes 72*ab* and 72*bb* of the memory cell capacitor are connected to each other through a conductive layer 78. In other words, capacitive elements 72*a* and 72*b* are connected to each other not through the impurity region but through the conductive layer 78. The substrate region is a P-type semiconductor layer. Therefore, the PN junction area between the substrate region and the impurity regions 77*a* and 77*b* is sufficiently reduced. By reducing the PN junction area, a junction leak current is reduced, and the data retention characteristics is further improved.

Figure 36B:
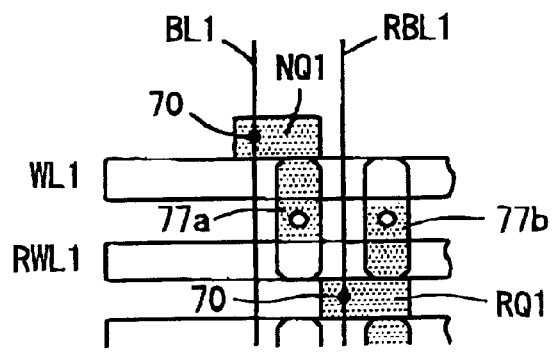
FIG. 36B is a diagram schematically showing the memory cell layout according to Embodiment 8 of the present invention.

FIG. 36B is a diagram schematically showing the two-dimensional layout of the memory cell capacitor shown in FIG. 36A. As shown in FIG. 36B, the impurity region 77*a* serves as one conduction node of the access transistor NQ1, and the impurity region 77*b* serves as one conduction node of the refresh transistor RQ1. These impurity regions 77*a* and 77*b* are separated from each other. The access and refresh transistors NQ1 and RQ1 are connected to the bit lines BL1 and RBL1 through the bit line contacts 70 respectively. Accordingly, in this case, the memory cell transistor layout is the same as the one-transistor/one-capacitor memory cell layout. A mask need only be changed so as to connect the storage nodes of the capacitor through the conductive layer 78. As a result; four-transistor/two-capacitor memory cells having a reduced leak current can be easily realized without any change in the conventional memory cell manufacturing process.

Embodiment 9

Figure 37:
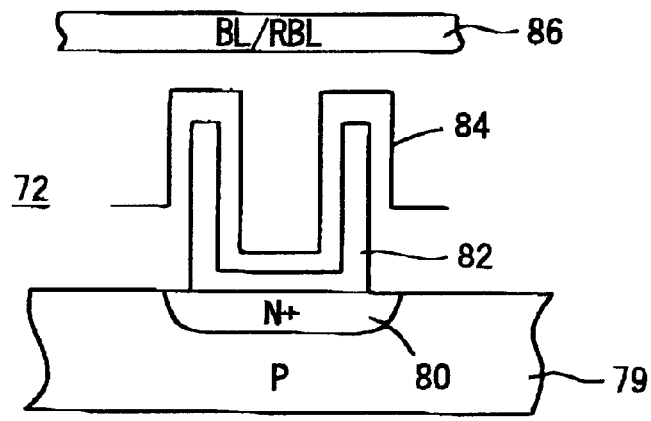
FIG. 37 is a diagram schematically showing the cross-sectional structure of a memory cell capacitor according to Embodiment 9 of the present invention.

FIG. 37 is a diagram schematically showing the structure of a capacitive element of a memory cell capacitor according to Embodiment 9 of the present invention. In FIG. 37, the capacitive element 72 includes a storage node 82 coupled to an N-type impurity region 80, a cell plate electrode layer 84 facing the storage node 82 through a capacitor insulating film, and a bit line conductive layer 86 provided over the cell plate electrode layer 84. The storage node 82 has a hollow, cylindrical shape. By arranging the storage node electrode layer 82 under the bit lines, the sidewall area of the storage node electrode layer 82 can be sufficiently increased As a result, a capacitive element occupying a small area as well as having a large capacitance value can be realized.

The storage node electrode layer 82 is electrically connected in the same manner as that in the case of the capacitive elements shown in FIGS. 34 to 36A. More specifically, the storage nodes may be connected to each other through a conductive layer, and the impurity region 80 may extend continuously. The impurity region 80 may be divided into impurity regions and only the storage node electrode layers 82 may be connected to each other through the conductive layer. Any one or combination of these structures may be used.

In FIG. 37, the memory cell capacitor is formed under the normal bit line BL or refresh bit line RBL. This structure is called a capacitor-under-bit line (CUB) structure. With such a structure, a memory cell capacitor occupying a small area as well as having a large capacitance value can be realized. Moreover, by arranging the bit line conductive layer 86 over the memory cell capacitor, a stress applied to the bit line can be reduced, and therefore the bit line conductive layer 86 can be formed of a metal interconnection layer. As a result, bit line resistance can also be reduced.

Embodiment 10

Figure 38:
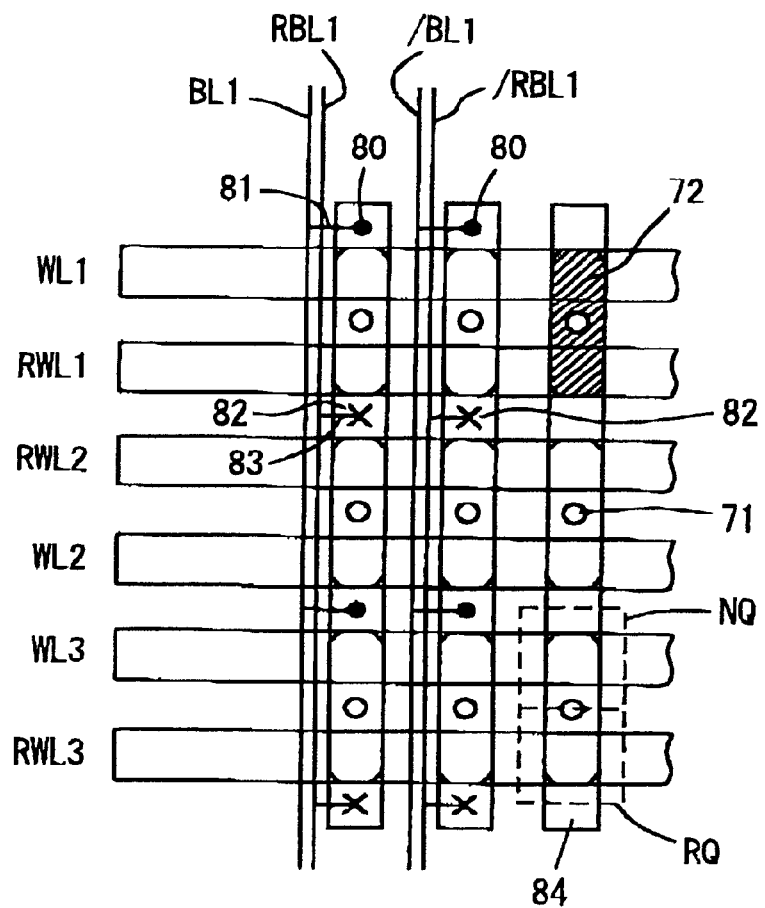
FIG. 38 is a diagram schematically showing the layout of a memory array portion of a semiconductor memory device according to Embodiment 10 of the present invention.

FIG. 38 is a diagram schematically showing the memory cell layout of a semiconductor memory device according to Embodiment 10 of the present invention. In FIG. 38, element active regions 84 forming the memory cells extend in the column direction. Memory cell capacitors 72 are also arranged in alignment with the element active regions. In the structure shown in FIG. 38, normal access transistors NQ and refresh transistors RQ are aligned in the column direction. The access transistors NQ are connected to corresponding bit lines through respective bit line contacts 80, and the refresh transistors RQ are coupled to corresponding refresh bit lines through respective refresh bit line contacts 82. Accordingly, in the arrangement of FIG. 38, the normal bit line contacts 80, capacitor contacts 71 and refresh bit line contacts 82 are aligned in the column direction, and the contacts of the same kind are aligned in the row direction.

The normal bit lines and refresh bit lines are provided in the regions between the element active regions 84 The pairs of normal and refresh bit lines BL, RBL and the pairs of complementary normal and refresh bit lines /BL, /RBL are alternately located in the regions between the element active regions 84 in the row direction. FIG. 38 exemplarily shows bit lines BL1, RBL1, /BL1 and /RBL1. In order to reduce the area of the regions between the element active regions 84 as much as possible, the normal bit lines BL, /BL and refresh bit lines RBL, /RBL are formed in different interconnection layers. As a result, the bit lines occupy a reduced interconnection area, resulting in reduced array area. Since the normal and refresh bit lines are provided in the regions between the element active regions, the bit lines BL and RBL are coupled to the bit line contacts 80 and 82 through extended lines 81 and 83, respectively, as shown in FIG. 38.

Figure 39A:
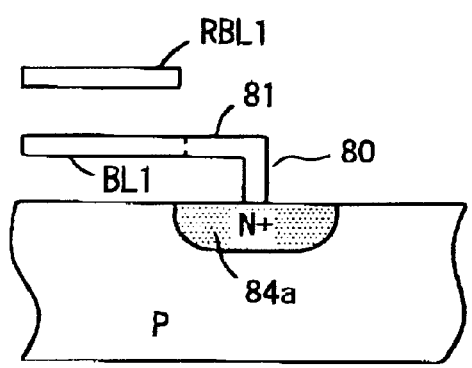
FIG. 39A is a diagram schematically showing the cross-sectional structure of a normal bit line contact portion of FIG. 38.

FIG. 39A is a diagram schematically showing the structure of a portion of the normal bit line contact 80. In FIG. 39A, the refresh bit line RBL1 is provided in alignment with the normal bit line BL1 in a layer located thereabove. The normal bit line contact 80 is coupled to the normal bit line BLi through the extended line 81. The bit line contact 80 is connected to an impurity region 84*a* of the element active region 84 Moreover, the normal bit line is extended to the bit line contact region by the extended line 81 in the vicinity of the region of the normal bit line contact 80. Thus, the normal bit line is coupled to the impurity region 84*a*.

Figure 39B:
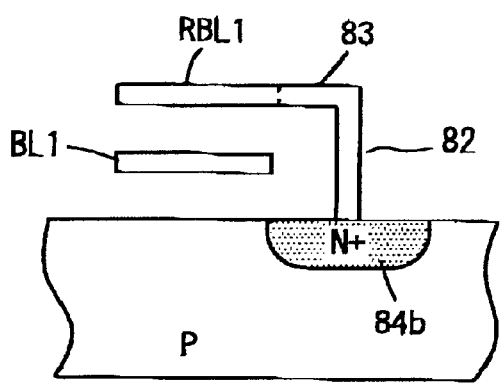
FIG. 39B is a diagram schematically showing the structure of a refresh bit line contact portion of FIG. 38.

FIG. 39B is a diagram schematically showing the structure of a portion of the refresh bit line contact 82. The refresh bit line RBL1 is coupled to the refresh bit line contact 82 through the extended line 83. This refresh bit line contact 82 is coupled to an impurity region 84b included in the element active region 84 The impurity regions 84a and 84b are separated from each other by the distance corresponding to a spacing between the normal word line WL and refresh word line RWL.

As shown in FIGS. 39A and 39B, by providing the normal bit lines BL and refresh bit lines RBL in different interconnection layers, the layout area of the bit lines can be reduced. Since the bit lines are merely connected to the corresponding bit line contacts through the extended lines 81 and 83, the bit line contacts can be easily formed without adversely affecting the multi-level interconnection layers.

It should be noted that the refresh bit lines are arranged below the normal bit lines.

As has been described above, according to Embodiment 10 of the present invention, the refresh bit lines and normal bit lines are formed in different interconnection layers, whereby the layout area of the bit lines can be reduced. Moreover, the element active regions forming the memory cell transistors extend in the column direction, and do not have any region projecting in the row direction. Therefore, the area of the memory cell formation regions can be reduced, and thus the memory cell array area can be reduced.

Embodiment 11

Figure 40:
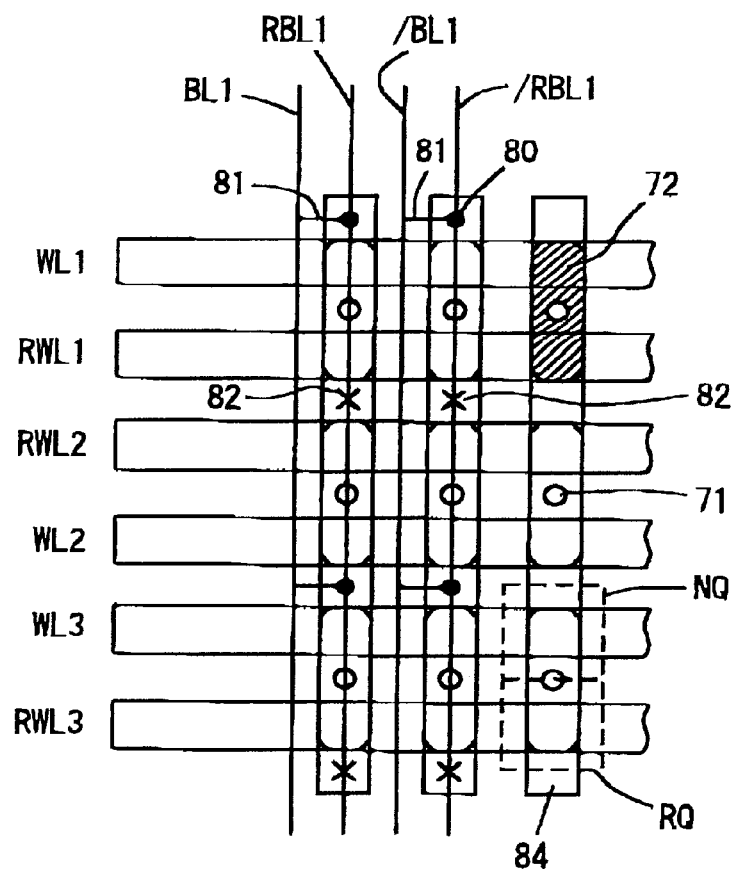
FIG. 40 is a diagram schematically showing the layout of an array portion of a semiconductor memory device according to Embodiment 11 of the present invention.

FIG. 40 is a diagram schematically showing the stricture of a memory array portion according to Embodiment 11 of the present invention. In the structure shown in FIG. 40, normal bit lines BL (BL1, /BL1) are provided in the regions between element active regions 84 Refresh bit lines RBL (RBL1, /RBL1) extending in the column direction are provided so as to overlap with the element active regions 84. The normal bit lines BL, /BL and refresh bit lines RBL, /RBL are alternately arranged and formed in different interconnection layers.

In the structure shown in FIG. 40, the normal bit lines BL and /BL do not overlap with the refresh bit lines RBL and /RBL Accordingly, a capacitance between the bit lines can be reduced, and therefore the read data can be rapidly transmitted to a corresponding sense amplifier. For example, in the case where refresh completion and normal access execution occur simultaneously, signals on the normal bit lines are changed in the direction opposite to that of signals on the refresh bit lines. As a result, the coupling noise is caused to hinder an accurate data read operation in the normal access. By reducing the capacitance between the bit lines, such an adverse effect due to the noise can be suppressed, enabling an accurate sensing operation of the memory cell data.

Figure 41A:
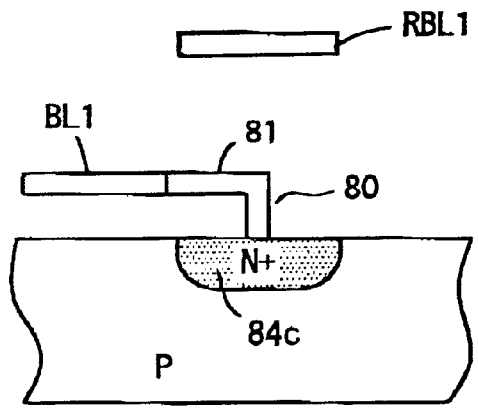
FIG. 41A is a diagram schematically showing the structure of a normal bit line contact portion of FIG. 40.

FIG. 41A is a diagram schematically showing the structure of a region of a normal bit line contact 80. In FIG. 41A, the refresh bit line RBL1 is formed in a layer located above the normal bit line BL1. The normal bit line contact 80 is coupled to the normal bit line BL1 through an extended line 81. The bit line contact 80 is connected to an impurity region 84c included in the element active region 84. In this case, the extended line 81 is merely formed in the normal bit line contact region. Therefore, the coupling capacitance between the bit lines BL1 and RBL1 can be sufficiently reduced.

Figure 41B:
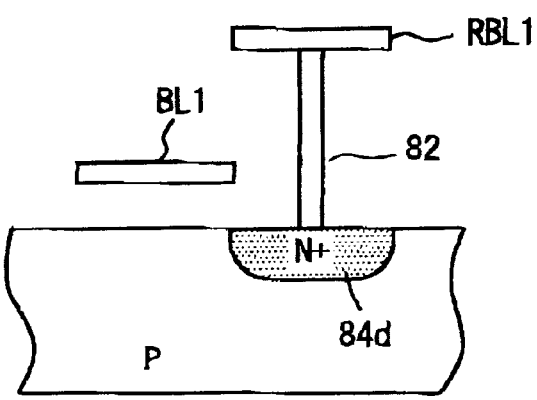
FIG. 41B is a diagram schematically showing the structure of a refresh bit line contact portion of FIG. 40.

FIG. 41B is a diagram schematically showing the structure of a portion of a refresh bit line contact 82. In FIG. 41B, the refresh bit line RBL1 is provided overlapping with the element active region 84, as viewed two-dimensionally. The refresh bit line contact 82 connects the refresh bit line RBL1 directly to an impurity region 84d included in the element active region without using an extended line. The normal bit line BL1 is provided in the region outside the element active regions 84 so as to prevent the refresh bit line contact 82 from affecting the layout of the normal bit line BL1.

Note that, in the foregoing description, the refresh bit lines are provided in the layer located above the normal bit lines. However, the normal bit lines BL and /BL may be formed in a layer located above the refresh bit lines RBL and /RBL.

As has been described above, according to Embodiment 11 of the present invention, the normal bit lines and refresh bit lines are formed in different interconnection layers and provided in different regions, as viewed two-dimensionally, whereby the capacitance between the bit lines can be reduced. As a result, a semiconductor memory device capable of performing an accurate, high-speed sensing operation can be realized. Moreover, the element active regions merely extend linearly in the column direction. Therefore, like Embodiment 10, the memory cell array area can also be reduced.

Embodiment 12

Figure 42:
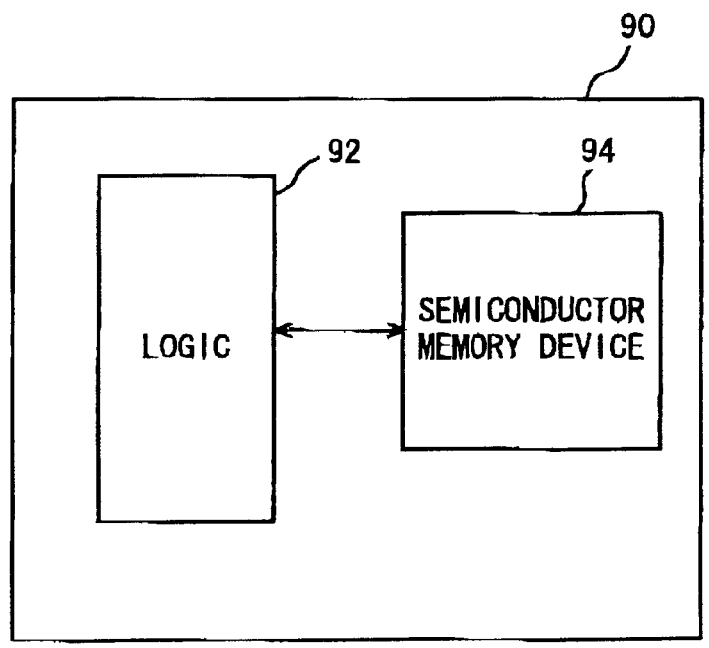
FIG. 42 is a diagram schematically showing the structure of a semiconductor integrated circuit device according to Embodiment 12 of the present invention.

FIG. 42 is a diagram schematically showing the structure of a semiconductor integrated circuit device according to Embodiment 12 of the present invention In FIG. 42, the semiconductor integrated circuit device 90 is formed by a logic 92 and a semiconductor memory device 94 of the present invention integrated on the same semiconductor chip. In the portable equipment such as portable telephones, a static random access memory (SRAM is used as a working memory. However, in order to satisfy the recent requirements for the portable terminals, such as a multi-color display screen and display of the Internet information, a 16 M-bit or 32 M-bit memory must be used as such working memory. Such a mass storage memory made of the SRAM has an increased chip size, thereby causing a significant increase in cost, In the semiconductor memory device 94 according to the present invention, a single memory cell is formed of four transistors and two capacitors. On the other hand, an SRAM memory cell requires six transistors, or four transistors and two load elements. In the semiconductor memory device 94 according to the present invention, the respective numbers of word lines and bit lines are twice those of the normal one-transistor/one-capacitor DRAM cells, and the area of the memory cell array portion is four times that of the normal DRAM. However, the area occupied by the SRAM memory cells is about seven to eight times that of the DRAM cells. Accordingly, the area occupied by the SRAM cells is 1.75 to 2 times that of the memory cells of the present invention. As a result, even if the four-transistor/two-capacitor memory cells are used, the occupation area of the memory array can be reduced as compared to the SRAM.

Moreover, the complementary data is read onto a bit line pair. Therefore, even if the capacitance value of the memory cell capacitor is about the same as that of the memory cell capacitor of the normal DRAM, the read voltage can be effectively doubled As a result, the operation margin that is sufficiently larger than that of the normal DRAM can be obtained. Moreover, the refresh operation is hardly required. More specifically, the refresh operation is hardly required in the standby state or in the sleep mode. Therefore, the standby current in addition to the occupation area can also be reduced. Moreover, the semiconductor memory device 94 has a fast access cycle of 70 ns. Therefore, by substituting the semiconductor memory device 94 according to the present invention for the SRAM currently used as working memory in the portable equipment, the semiconductor integrated circuit device 90 having a mass storage working memory with low current consumption and small occupying area can be realized.

Note that, like a normal system LSI, the DRAM and flash memory may be integrated on the same chip in the semiconductor integrated circuit device 90 shown in FIG. 42.

As has been described above, according to Embodiment 12 of the present invention, the logic and the semiconductor memory device are integrated on the same chip. Therefore, a processing system having a high-speed, mass storage memory with low current consumption can be realized in applications such as portable equipment.

Embodiment 13

Figure 43:
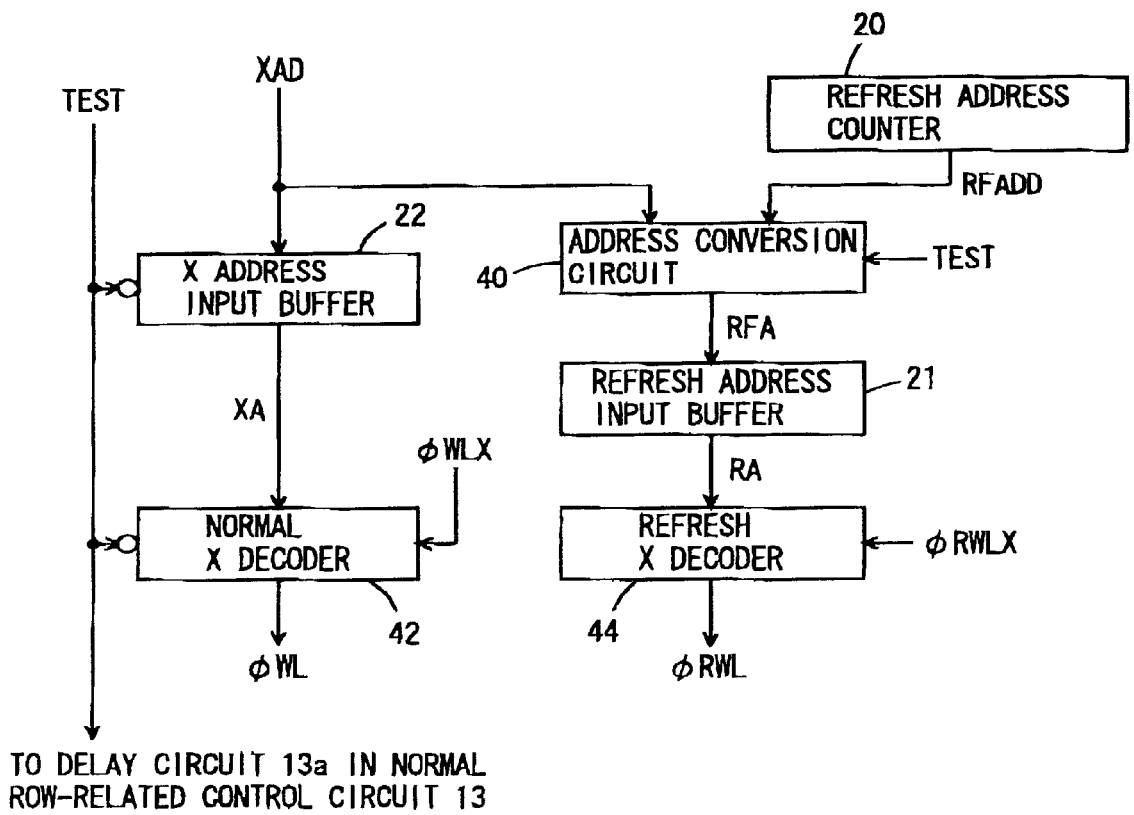
FIG. 43 is a diagram schematically showing the structure of a main part of a semiconductor memory device according to Embodiment 13 of the present invention.
Figure 44:
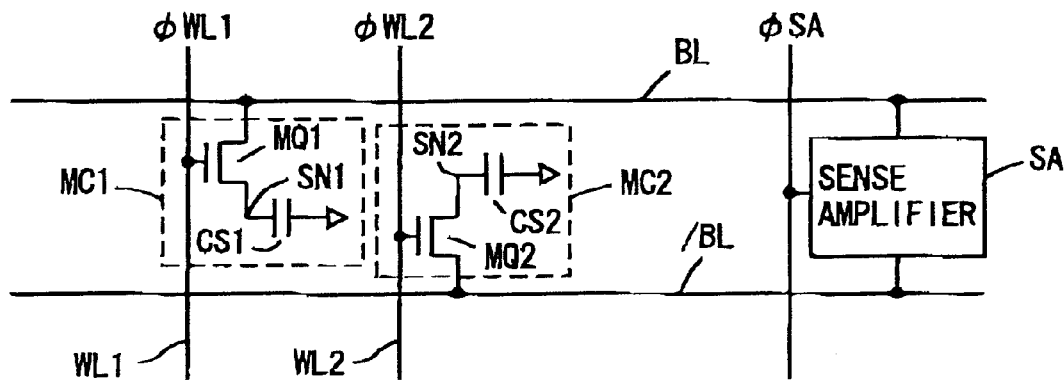
FIG. 44 is a diagram showing the structure of an array portion of a conventional DRAM.
Figure 45:
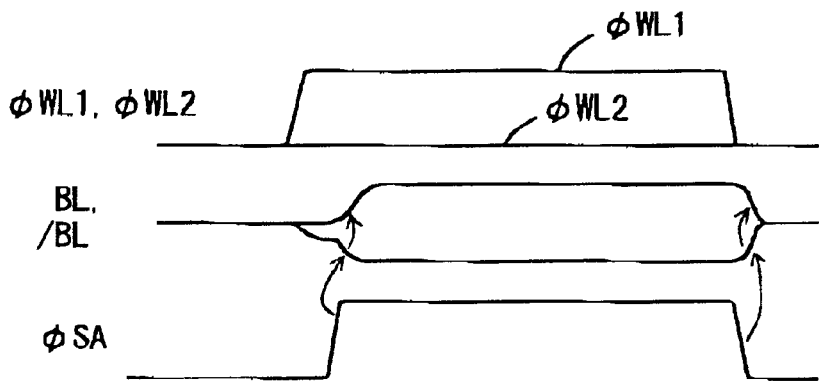
FIG. 45 is a signal waveform diagram representing the operation of the memory cell array shown in FIG. 44.

FIG. 43 is a diagram schematically showing the structure of a main portion of a semiconductor memory device according to Embodiment 13 of the present invention. The structure shown in FIG. 43 corresponds to that of the address conversion portion shown in FIG. 22, In the structure shown in FIG. 43, a test mode instruction signal TEST is applied to the X address input buffer 22 and normal X decoder 42 The X address input buffer 22 and normal X decoder 42 are deactivated in response to activation of the test mode instruction signal TEST. The test mode instruction signal TEST is also applied to the delay circuit 13a provided in the normal row-related control circuit 13 shown in FIG. 16. The delay circuit 13a holds its output signal CED inactive while the test mode instruction signal TEST is active.

The other structure is the same as that shown in FIG. 22. The corresponding portions are denoted with the same reference numerals, and detailed description thereof will be omitted. The arbitration circuit 13 has the same structure as that shown in FIG. 25. More specifically, in the test mode, the arbitration operation is inhibited, and the refresh activation signal REF is activated according to the internal chip enable signal CE. In the test mode, the address conversion circuit 40 selects the external X address signal XAD and applies it to the refresh X decoder 44. Since the refresh activation signal REF is active, a refresh row (refresh word line) is selected according to the external X address XAD.

In the normal row-related control circuit, the delay circuit 13a is in the inactive state Therefore, even if the internal chip enable signal CE is activated, the delayed activation signal CED is inactive and the normal row selection is not performed The X address input buffer 22 and normal X decoder 42 are also in the inactive state. Therefore, the normal row-related circuit is entirely in the inactive state.

Refresh word line selection can be performed under the external control. Therefore, a refresh word line can be selected faster than in the case where the refresh timer is used, whereby the refresh word line can be tested at a high speed. For example, in the case where the burn-in test is performed on the refresh word lines, the refresh word line selection can be controlled externally, and a voltage stress can be applied to a refresh word line. As a result, accurate burn-in test can be performed to the refresh word lines Moreover, defects such as short-circuit between a refresh word line and normal or refresh word line can be reliably detected.

Note that, by using the test mode instruction signal TESTr shown in FIG. 27 as the test mode instruction signal TEST, whether or not the refresh-related circuitry is accurately operated can be determined under the external control. In this case, the arbitration circuit may be configured to hold the normal row activation signal inactive while the test mode instruction signal TESTr is active.

Moreover, in the test mode, the internal chip enable signal CE may be produced according to the external chip enable signal /CEex, or may be produced according to a transition in external address.

As has been described above, according to Embodiment 13 of the present invention, an external address is used as refresh address in the test mode. Moreover, the refresh row-related circuit is activated as well as normal row-related circuit is kept in the inactive state under the external control. Therefore, a refresh word line can be selected and tested at a high speed.

According to the present invention, the complementary data is read onto a bit line pair, and the refresh operation can be internally performed independently of the external access. Therefore, the external apparatus need not interrupt its processing due to the refresh operation, thereby achieving improvement in system performance. Moreover, by reading the complementary data, a semiconductor memory device can be realized which is capable of effectively obtaining a large read voltage as well as significantly reducing current consumption in the standby state.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor memory device, comprising:

a plurality of memory cells arranged in rows and columns;

a plurality of normal bit line pairs provided corresponding to the respective memory cell columns and each having the memory cells of a corresponding column connected thereto, each normal bit line pair having a first normal bit line and a second normal bit line;

a plurality of refresh bit Line pairs provided corresponding to the respective memory cell columns and each having the memory cells of a corresponding column connected thereto, each refresh bit line pair having a first refresh bit line and a second refresh bit line;

each of the plurality of memory cells including a first transistor provided between the first normal bit line of a corresponding column and a first storage node, a first capacitance provided between the first storage node and a constant voltage source, a second transistor provided between the first refresh bit line of the corresponding column and the first storage node, a third transistor provided between the second normal bit line of the corresponding column and a second storage node, a second capacitance provided between the second storage node and the constant voltage source, and a fourth transistor provided between the second storage node and the second refresh bit line of the corresponding column;

a plurality of normal word lines provided corresponding to the respective memory cell rows and each having the first and third transistors of the memory cells of a corresponding row connected thereto; and a plurality of refresh word lines provided corresponding to the respective memory cell rows and each having the second and fourth transistors of the memory cells of a corresponding row connected thereto.

2. The semiconductor memory device according to claim 1, further comprising:

refresh row selection circuitry for selecting an addressed refresh word line from the plurality of refresh word lines according to a refresh address;

normal row selection circuitry for selecting an addressed normal word line from the plurality of normal word lines according to an external address; and arbitration circuitry for arbitrating a selection operation of the refresh row selection circuitry and the normal row selection circuitry in response to a refresh request signal and a memory cell selection cycle start instruction signal.

3. The semiconductor memory device according to claim 2, wherein the arbitration circuitry receives the memory cell selection cycle start instruction signal and the refresh request signal, and when the received refresh request signal is activated earlier than the memory cell selection cycle start instruction signal, the arbitration circuitry activates the refresh row selection circuitry and then activates the normal row selection circuitry.

4. The semiconductor memory device according to claim 3, further comprising a plurality of refresh sense amplifiers provided corresponding to the plurality of refresh bit line pairs, for differentially amplifying voltages on corresponding bit line pairs when activated, wherein when activation of the refresh request signal is earlier, the arbitration circuitry activates the normal row selection circuitry in response to activation of the refresh sense amplifiers.

5. The semiconductor memory device according to claim 2, further comprising:

normal row selection control circuitry for activating the normal row selection circuitry when activated;

refresh row selection control circuitry for activating the refresh row selection circuitry when activated; and arbiter circuitry for selectively activating the normal row selection control circuitry and the refresh row selection control circuitry in response to a memory cell selection cycle start instruction signal and a refresh instruction signal, the arbiter circuitry activating a selection operation instruction signal for one of the normal row selection control try and the refresh row selection control circuitry corresponding to one that is activated earlier between the memory cell selection cycle start instruction signal and the refresh instruction signal, and holding a selection operation instruction signal for other row selection control circuitry inactive.

6. The semiconductor memory device according to claim 5, further comprising:

a plurality of normal sense amplifiers provided corresponding to the plurality of normal bit line pairs, for differentially amplifying voltages on corresponding normal bit line pairs when activated; and a plurality of refresh sense amplifiers provided corresponding to the plurality of refresh bit line pairs, for differentially amplifying voltages on corresponding refresh bit line pairs when activated, wherein the normal row selection control circuitry activates the normal row selection circuitry in response to activation of an internal memory cell selection instruction signal and a normal row selection operation instruction signal from the arbiter circuitry, or in response to activation of the internal memory cell selection instruction signal and a refresh sense amplifier activation signal from the refresh row selection control circuitry, the internal memory cell selection instruction signal being activated in response to activation of the memory cell selection cycle start instruction signal, and the refresh row selection control circuitry activates the refresh row selection circuitry in response to activation of the refresh instruction signal and a refresh row selection operation instruction signal from the arbiter circuitry, or in response to activation of the refresh instruction signal and a normal sense amplifier activation signal from the normal row selection control circuitry.

7. The semiconductor memory device according to claim 1, further comprising:

determination Circuitry for determining whether a refresh address and an external address match each other;

comparison circuitry for comparing respective activation timings of a refresh request signal and a memory cell selection instruction signal with each other; and access circuitry for accessing data through a corresponding refresh bit line pair when the determination circuitry detects matching and the comparison circuitry indicates that activation of the refresh request signal is earlier.

8. The semiconductor memory device according to claim 7, wherein the access circuitry includes a plurality of refresh column selection gates provided corresponding to the plurality of refresh bit line pairs, for coupling corresponding refresh bit line pairs to an internal data bus when rendered conductive, a plurality of normal column selection gates provided corresponding to the plurality of normal bit line pairs, for coupling corresponding normal bit line pairs to the internal data bus when rendered conductive, and a column selection circuit for transmitting a column selection signal produced according to a column address to the plurality of refresh column selection gates in response to a match detection instruction signal from the determination circuitry and an indication from the comparison circuitry that activation of the refresh request signal is earlier.

9. The semiconductor memory device according to claim 1, further comprising an address transition detection circuit for detecting a transition in an external address signal to generate a memory cell selection instruction signal.

10. The semiconductor memory device according to claim 1, wherein the refresh bit lines and the normal bit lines are formed in different interconnection layers.

11. The semiconductor memory device according to claim 1, wherein in each of the memory cells , the first and second triton s a re connected to each other through an impurity region and connected to the first storage node, and the third and fourth transistors are connected to each other through an impurity region coupled to the second storage node.

12. The semiconductor memory device according to claim 1, wherein the first refresh bit line and the first normal bit line are provided on one side of at first active region forming the first and third transistors of corresponding memory cells, and the second refresh bit line and the second normal bit line are provided on one side of a second active region forming the second and fourth transistors of the corresponding memory cells, and the first active region and the second active region are provided alternately in a row direction.

13. The semiconductor memory device according to claim 10, wherein the normal bit lines and the refresh bit lines are provided alternately such that each normal bit line is located between a corresponding refresh bit line pair and each refresh bit line is located between a corresponding normal bit line pair.

14. The semiconductor memory device according to claim 1, wherein
the first and second transistors share an impurity region connected to the first storage node,
the first capacitance includes a first capacitive element having a storage electrode node connected to the impurity region, and a second capacitive element connected to the first capacitive element through the impurity region and having a storage electrode node formed separately from the storage electrode node of the first capacitive element,
the third and fourth transistors share a second impurity region connected to the second storage node, and
the second capacitance includes a third capacitive element having a storage electrode node connected to the second impurity region, and a fourth capacitive element connected to the third capacitive element through the second impurity region and having a storage electrode node formed separately from the storage electrode node of the third capacitive element.

15. The semiconductor memory device according to claim 1, wherein
the first capacitance includes: a fist capacitive element having a main electrode connected to a first impurity region of the first transistor; a second capacitive element having a main electrode connected to a second impurity region of the second transistor, the first and second impunity regions being physically separated from each other; and a conductive layer for connecting the respective main electrodes of the first and second capacitive elements, and
the second capacitance includes: a third capacitive element having a main electrode connected to a third impurity region of the third transistor; a fourth capacitive element having a main electrode connected to a fourth impurity region of the fourth transistor, the third and fourth impurity regions being physically separated from each other; and a conductive layer for connecting the respective main electrodes of the third and fourth capacitive elements.

16. The semiconductor memory device according to claim 1, further comprising an address conversion circuit responsive to a test mode instruction signal for selecting one of an external address signal and a refresh address signal from a refresh address generation circuit to produce an internal refresh address signal designating a row of the memory cells to be refreshed.

17. The semiconductor memory device according to claim 1, further comprising a mode conversion circuit responsive to a test mode instruction signal for selecting one of a refresh request signal and a memory cell selection cycle start instruction signal to produce an internal refresh request signal.

18. The semiconductor memory device according to claim 2, further comprising a circuit responsive to a test mode instruction signal for inhibiting an arbitration operation of the arbitration circuitry.

19. The semiconductor memory device according to claim 2, wherein the memory cell selection cycle start instruction signal is activated in response to a transition in an external address signal.

20. The semiconductor memory device according to clam 2, further comprising:
an address transition detection circuit for detecting a transition in an external address signal to generate a pulse signal having a predetermined time duration as the memory cell selection cycle start instruction signal; and
a memory cycle control circuit for activating a memory cell selection instruction signal in response to deactivation of the pulse signal and deactivating the memory cell selection instruction signal in response to the transition in the external address signal.

* * * * *